(12) United States Patent
Friedenberg

(10) Patent No.: US 10,489,287 B2
(45) Date of Patent: Nov. 26, 2019

(54) CONDUCTING AUTOMATED SOFTWARE TESTING USING CENTRALIZED CONTROLLER AND DISTRIBUTED TEST HOST SERVERS

(71) Applicant: Bank of America Corporation, Charlotte, NC (US)

(72) Inventor: Gedaliah Friedenberg, Spring Valley, NY (US)

(73) Assignee: Bank of America Corporation, Charlotte, NC (US)

( * ) Notice: Subject to any disclaimer, the term of this patent is extended or adjusted under 35 U.S.C. 154(b) by 276 days.

(21) Appl. No.: 15/594,823

(22) Filed: May 15, 2017

(65) Prior Publication Data

US 2018/0329812 A1 Nov. 15, 2018

(51) Int. Cl.
*G06F 11/36* (2006.01)
*G06F 3/0484* (2013.01)
*G06F 11/07* (2006.01)
*H03M 13/01* (2006.01)

(52) U.S. Cl.
CPC ...... *G06F 11/3696* (2013.01); *G06F 11/0709* (2013.01); *G06F 11/3664* (2013.01); *G06F 11/3684* (2013.01); *G06F 11/3688* (2013.01); *H03M 13/015* (2013.01)

(58) Field of Classification Search
CPC ............. G06F 11/3696; G06F 11/3688; G06F 11/3664; G06F 11/3684; G06F 11/0709; H03M 13/015
USPC ......................................... 714/38.1; 717/124
See application file for complete search history.

(56) References Cited

U.S. PATENT DOCUMENTS

| 6,182,245 B1 | 1/2001 | Akin et al. |
| 6,304,982 B1 | 10/2001 | Mongan et al. |
| 6,446,109 B2 | 9/2002 | Gupta |
| 7,451,163 B2 | 11/2008 | Selman et al. |
| 7,827,565 B2 | 11/2010 | Minium, Jr. et al. |

(Continued)

OTHER PUBLICATIONS

May 24, 2018 (US) Non-Final Office Action—U.S. Appl. No. 15/594,896.

(Continued)

*Primary Examiner* — John Q Chavis
(74) *Attorney, Agent, or Firm* — Banner & Witcoff, Ltd.; Michael A. Springs

(57) ABSTRACT

Aspects of the disclosure relate to conducting automated software testing using a centralized controller and one or more distributed test host servers. A computing platform may receive a test execution request. Subsequently, the computing platform may retrieve test specification details information and may identify one or more tests to execute. Then, the computing platform may generate one or more remote test execution commands directing a test host server farm to execute the one or more tests. In addition, generating the one or more remote test execution commands may include constructing one or more command line instructions to be executed by the test host server farm and inserting the one or more command line instructions into the one or more remote test execution commands. Thereafter, the computing platform may send the one or more remote test execution commands to the test host server farm.

20 Claims, 16 Drawing Sheets

(56) References Cited

U.S. PATENT DOCUMENTS

| | | | |
|---|---|---|---|
| 8,458,664 B2* | 6/2013 | Macedo | G06F 9/45512 |
| | | | 717/124 |
| 8,533,676 B2 | 9/2013 | Watters et al. | |
| 8,745,585 B2 | 6/2014 | Watters et al. | |
| 8,893,087 B2* | 11/2014 | Maddela | G06F 8/70 |
| | | | 714/745 |
| 9,053,238 B2 | 6/2015 | Krishnan et al. | |
| 9,058,430 B2 | 6/2015 | Pal et al. | |
| 9,092,578 B2 | 7/2015 | Wefers | |
| 9,116,779 B2 | 8/2015 | McClamroch et al. | |
| 9,164,759 B2 | 10/2015 | McClamroch et al. | |
| 9,459,839 B2 | 10/2016 | Kisynski et al. | |
| 9,576,252 B2 | 2/2017 | Haber | |
| 2004/0158837 A1* | 8/2004 | Sengodan | G06F 17/218 |
| | | | 719/313 |
| 2009/0307763 A1* | 12/2009 | Rawlins | G06F 9/44505 |
| | | | 726/5 |
| 2010/0228789 A1* | 9/2010 | Macedo | G06F 9/45512 |
| | | | 707/803 |
| 2011/0035629 A1* | 2/2011 | Noller | G06F 11/3688 |
| | | | 714/38.14 |
| 2012/0173239 A1 | 7/2012 | Sanchez Asenjo et al. | |
| 2015/0006966 A1 | 1/2015 | Dimitrovich et al. | |
| 2016/0170864 A1 | 6/2016 | Li | |
| 2016/0188450 A1* | 6/2016 | Appusamy | G06F 11/3664 |
| | | | 714/38.1 |
| 2017/0024307 A1 | 1/2017 | Peng | |
| 2017/0078159 A1 | 3/2017 | Bae et al. | |
| 2017/0108572 A1 | 4/2017 | Micek et al. | |
| 2017/0109262 A1 | 4/2017 | Trivedi | |
| 2017/0109356 A1 | 4/2017 | Sawal et al. | |
| 2017/0109486 A1 | 4/2017 | Tran | |
| 2017/0109515 A1 | 4/2017 | Aharoni et al. | |
| 2017/0109534 A1 | 4/2017 | Compagna et al. | |
| 2017/0109554 A1 | 4/2017 | Barvick et al. | |
| 2017/0109615 A1 | 4/2017 | Yatziv et al. | |
| 2017/0109644 A1 | 4/2017 | Nariyambut Murali et al. | |
| 2017/0109673 A1 | 4/2017 | Bell | |
| 2017/0109692 A1 | 4/2017 | Zumsteg et al. | |
| 2017/0109697 A1 | 4/2017 | Panemangalore et al. | |
| 2017/0109698 A1 | 4/2017 | Panemangalore et al. | |
| 2017/0109814 A1 | 4/2017 | Boudville | |
| 2017/0111225 A1 | 4/2017 | Sawal et al. | |
| 2017/0111248 A1 | 4/2017 | German et al. | |
| 2017/0111523 A1 | 4/2017 | Ackley | |
| 2017/0111573 A1 | 4/2017 | Wheeler et al. | |
| 2017/0112813 A1 | 4/2017 | Deretic et al. | |
| 2017/0113664 A1 | 4/2017 | Nix | |
| 2017/0115977 A1 | 4/2017 | Kim et al. | |
| 2017/0116232 A1 | 4/2017 | Marwah et al. | |
| 2017/0116355 A1 | 4/2017 | Harper et al. | |
| 2017/0116384 A1 | 4/2017 | Ghani | |
| 2017/0116497 A1 | 4/2017 | Georgescu et al. | |
| 2017/0116647 A1 | 4/2017 | Hassan et al. | |
| 2017/0116870 A1 | 4/2017 | Brem et al. | |
| 2017/0116881 A1 | 4/2017 | Cohen et al. | |
| 2017/0118037 A1 | 4/2017 | Kitchen et al. | |
| 2017/0119282 A1 | 5/2017 | Clark et al. | |
| 2017/0123424 A1 | 5/2017 | Cavender-Bares | |
| 2017/0123751 A1 | 5/2017 | Sigursson et al. | |
| 2017/0123761 A1 | 5/2017 | Childs et al. | |
| 2017/0123763 A1 | 5/2017 | Childs et al. | |
| 2017/0123766 A1 | 5/2017 | Childs et al. | |
| 2017/0123820 A1 | 5/2017 | Nishi et al. | |
| 2017/0123950 A1 | 5/2017 | Payette et al. | |
| 2017/0124121 A1 | 5/2017 | Fitterer et al. | |
| 2017/0124127 A1 | 5/2017 | Fitterer et al. | |
| 2017/0124157 A1 | 5/2017 | Keohane et al. | |
| 2017/0124284 A1 | 5/2017 | McCullough et al. | |
| 2017/0124285 A1 | 5/2017 | McCullough et al. | |
| 2017/0124432 A1 | 5/2017 | Chen et al. | |
| 2017/0124487 A1 | 5/2017 | Szeto et al. | |
| 2017/0124526 A1 | 5/2017 | Sanderford et al. | |
| 2017/0124596 A1 | 5/2017 | Wang et al. | |
| 2017/0124726 A1 | 5/2017 | Soulard et al. | |
| 2017/0124856 A1 | 5/2017 | Benien et al. | |
| 2017/0126741 A1 | 5/2017 | Lang et al. | |
| 2017/0126787 A1 | 5/2017 | Martinez et al. | |
| 2017/0220459 A1 | 8/2017 | Kulkarni et al. | |
| 2018/0107201 A1 | 4/2018 | Cu-Unjieng et al. | |
| 2018/0113774 A1 | 4/2018 | Kyzlink et al. | |

OTHER PUBLICATIONS

"Software testing," From Wikipedia, the free encyclopedia, retireved May 10, 2017 from https://en.wikipedia.org/wiki/Software_testing.

Nov. 7, 2018 (US) Notice of Allowance—U.S. Appl. No. 15/594,896.

* cited by examiner

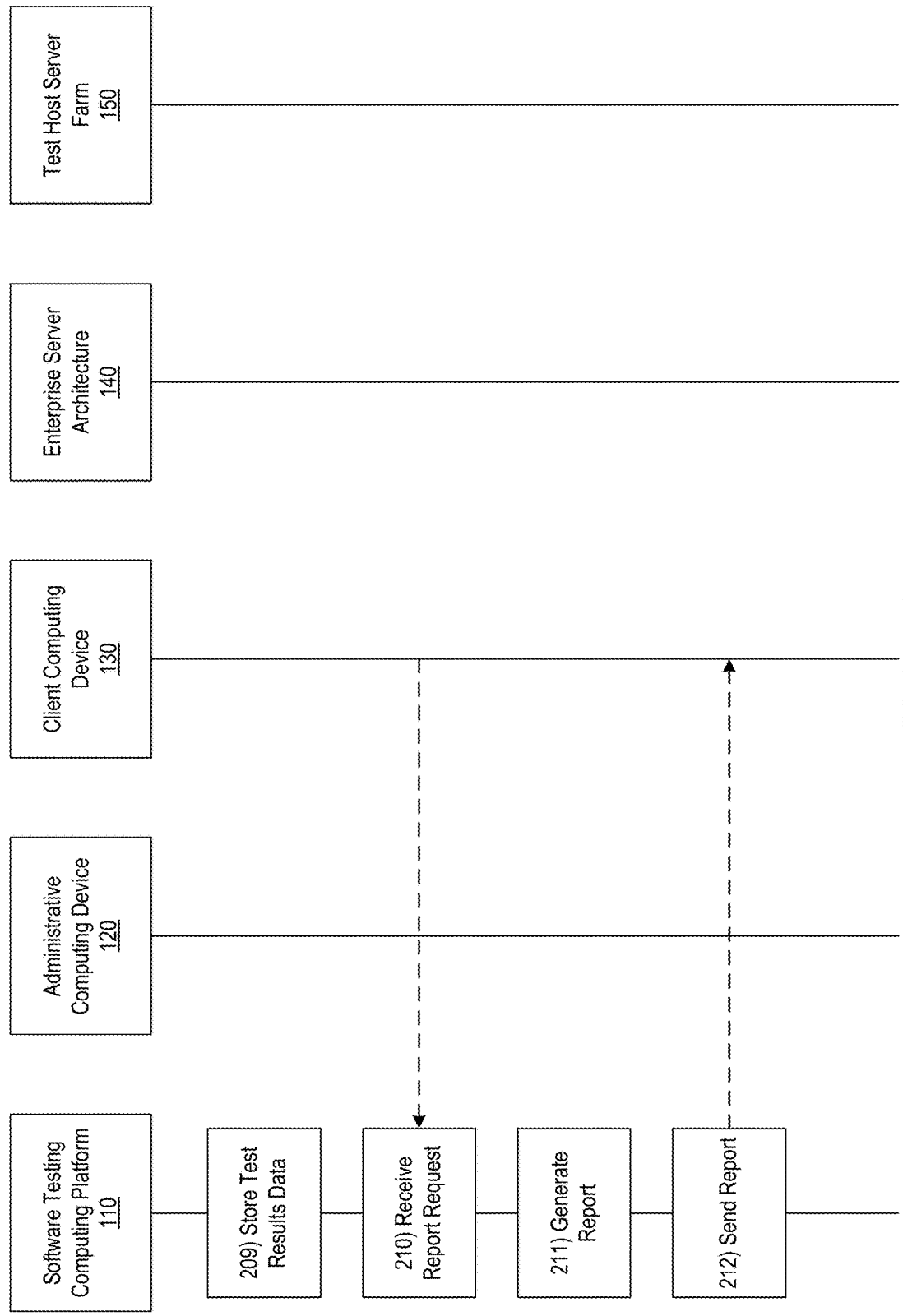

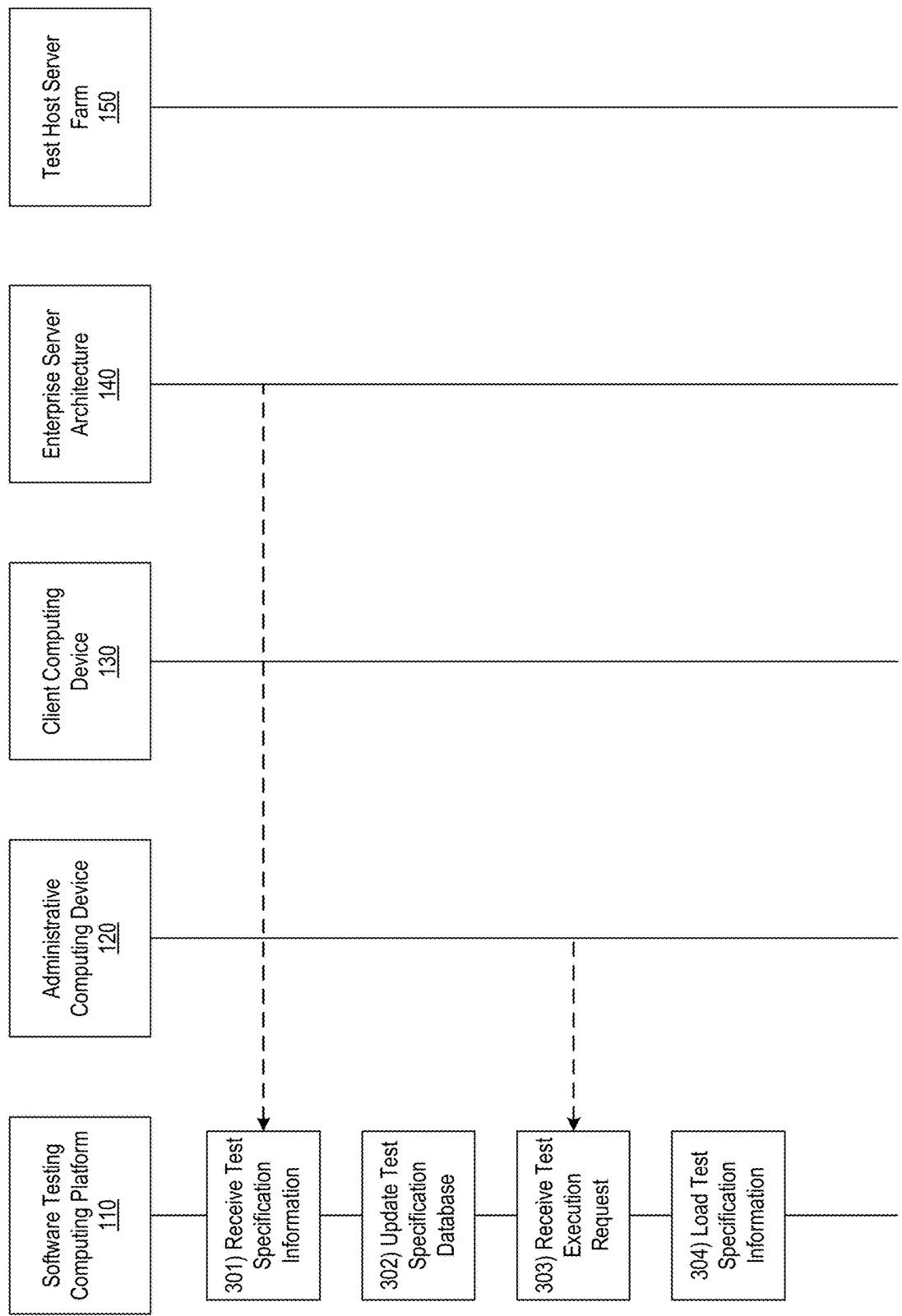

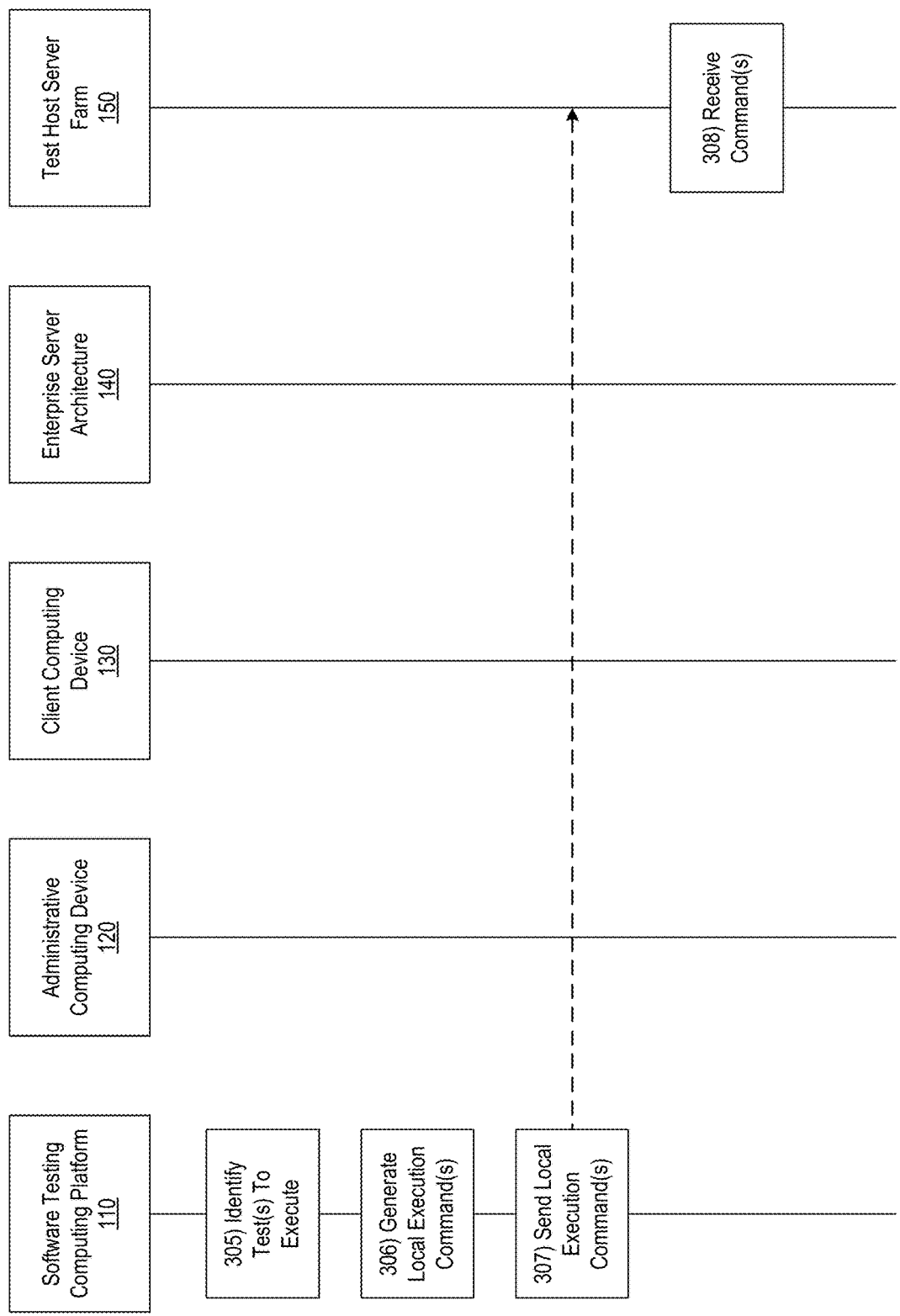

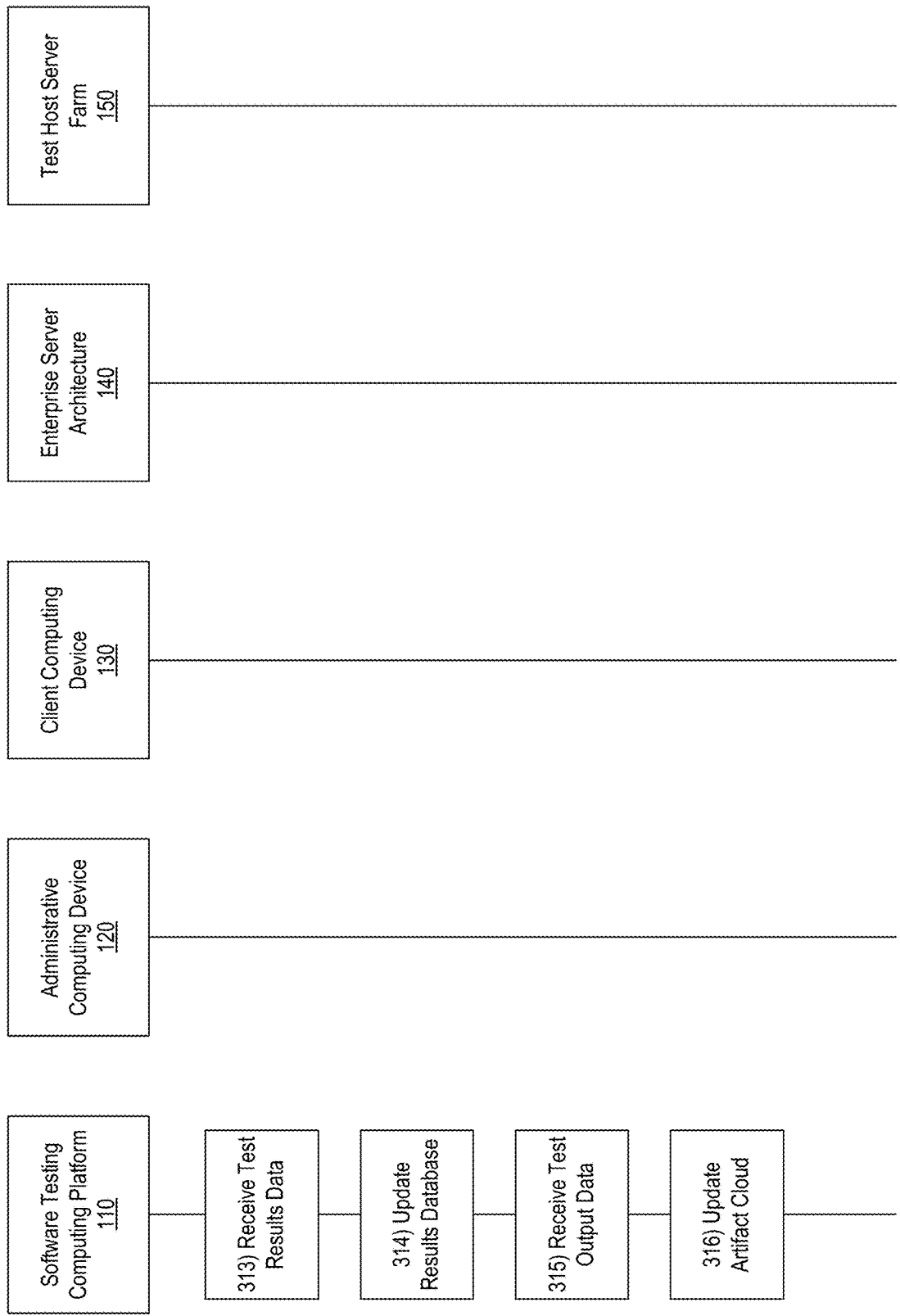

CONDUCTING AUTOMATED SOFTWARE TESTING USING CENTRALIZED CONTROLLER AND DISTRIBUTED TEST HOST SERVERS

BACKGROUND

Aspects of the disclosure relate to electrical computers, digital processing systems, and automated task management and control. In particular, one or more aspects of the disclosure relate to conducting automated software testing using a centralized controller and one or more distributed test host servers.

Many organizations have existing investments in automated software testing that often span numerous tools running on multiple platforms (e.g., different operating systems) to test various applications and/or systems. Typically, the way in which particular tests are launched may vary based on the tools and platforms being tested. These variances may create significant challenges in running, controlling, and/or monitoring tests, as such testing might require subject matter experts who are trained with the specific platform, the application and/or system, and the testing tool to be used in conducting a particular test. Further, the results of different tests may have different formats and different artifacts, which in turn may make it difficult to create unified, standardized, and easily accessible reporting of test results. Moreover, because of the differences across the various platforms, applications, systems, and testing tools, it may be difficult to optimize the efficient and effective technical operations of the hardware and software needed to conduct software testing.

SUMMARY

Aspects of the disclosure provide effective, efficient, scalable, and convenient technical solutions that address and overcome the technical problems associated with testing different software applications and/or computing systems across various platforms using various testing tools by conducting automated software testing using a centralized controller and one or more distributed test host servers.

In accordance with one or more embodiments, a computing platform having at least one processor, a memory, and a communication interface may receive, via the communication interface, from an administrative computing device, a test execution request. Subsequently, the computing platform may retrieve, from a test specification database, test specification details information based on the test execution request received from the administrative computing device. Next, the computing platform may identify one or more tests to execute based on the test specification details information retrieved from the test specification database and the test execution request received from the administrative computing device. Then, the computing platform may generate one or more remote test execution commands directing a test host server farm to execute the one or more tests identified based on the test specification details information retrieved from the test specification database and the test execution request received from the administrative computing device. In addition, generating the one or more remote test execution commands may include constructing one or more command line instructions to be executed by the test host server farm and inserting the one or more command line instructions to be executed by the test host server farm into the one or more remote test execution commands. Thereafter, the computing platform may send, via the communication interface, to the test host server farm, the one or more remote test execution commands directing the test host server farm to execute the one or more tests identified based on the test specification details information retrieved from the test specification database and the test execution request received from the administrative computing device.

In some embodiments, receiving the test execution request from the administrative computing device may include receiving information identifying a specific software application to be tested in a specific computing environment.

In some embodiments, after sending the one or more remote test execution commands to the test host server farm, the computing platform may remotely capture test output from the test host server farm. Subsequently, the computing platform may store test results data based on remotely capturing the test output from the test host server farm.

In some embodiments, the one or more command line instructions to be executed by the test host server farm may cause the test host server farm to run one or more tests that write pass-fail output associated with the one or more tests to a console. In some instances, remotely capturing the test output from the test host server farm may include capturing the pass-fail output associated with the one or more tests from the console.

In some embodiments, remotely capturing the test output from the test host server farm may include processing the test output captured from the test host server farm to produce the test results data. In some instances, processing the test output captured from the test host server farm to produce the test results data may include determining that a first set of tests passed based on the test output captured from the test host server farm and determining that a second set of tests failed based on the test output captured from the test host server farm.

In some embodiments, storing the test results data based on remotely capturing the test output from the test host server farm may include storing results information in a test results database and storing test artifacts in a test artifact cloud. In some instances, storing the results information in the test results database may include storing timestamps indicating when one or more specific tests started and ended, information identifying a name of a specific host on which the one or more specific tests were run, information identifying a number of assertions that passed, and information identifying a number of assertions that failed.

In some embodiments, prior to receiving the test execution request from the administrative computing device, the computing platform may receive at least a portion of the test specification details information from enterprise server architecture. Subsequently, the computing platform may store the at least the portion of the test specification details information in the test specification database.

In some embodiments, the computing platform may receive, via the communication interface, from a client computing device, a request for test results information. In response to receiving the request for the test results information from the client computing device, the computing platform may generate a test results report. Subsequently, the computing platform may send, via the communication interface, to the client computing device, the test results report.

In some instances, receiving the request for the test results information from the client computing device may include receiving the request for the test results information via a web dashboard provided to the client computing device. In some instances, receiving the request for the test results information from the client computing device may include receiving the request for the test results information via an application programming interface.

In accordance with one or more additional embodiments, a computing platform having at least one processor, a memory, and a communication interface may receive, via the communication interface, from an administrative computing device, a test execution request. Subsequently, the computing platform may retrieve, from a test specification database, test specification details information based on the test execution request received from the administrative computing device. Next, the computing platform may identify one or more tests to execute based on the test specification details information retrieved from the test specification database and the test execution request received from the administrative computing device. Then, the computing platform may generate one or more local test execution commands directing a test host server farm to execute the one or more tests identified based on the test specification details information retrieved from the test specification database and the test execution request received from the administrative computing device. In addition, the one or more local test execution commands may direct the test host server farm to locally construct one or more command line instructions to be executed by the test host server farm to complete the one or more tests. Thereafter, the computing platform may send, via the communication interface, to the test host server farm, the one or more local test execution commands directing the test host server farm to execute the one or more tests identified based on the test specification details information retrieved from the test specification database and the test execution request received from the administrative computing device.

In some embodiments, receiving the test execution request from the administrative computing device may include receiving information identifying a specific software application to be tested in a specific computing environment.

In some embodiments, after sending the one or more local test execution commands to the test host server farm, the computing platform may receive, via a tests results service, test results data from the test host server farm. Subsequently, the computing platform may store the test results data received from the test host server farm via the tests results service in a test results database.

In some embodiments, the one or more local test execution commands may cause a client application executed on the test host server farm to run one or more tests on the test host server farm that write pass-fail output associated with the one or more tests to a console on the test host server farm.

In some embodiments, the one or more local test execution commands may cause the client application executed on the test host server farm to locally capture output from the one or more tests run on the test host server farm. In some instances, the one or more local test execution commands may cause the client application executed on the test host server farm to locally process the output captured from the one or more tests run on the test host server farm.

In some embodiments, the one or more local test execution commands may cause the client application executed on the test host server farm to locally process the output captured from the one or more tests run on the test host server farm by determining, at the test host server farm, that a first set of tests passed based on the output captured from the one or more tests run on the test host server farm and by determining, at the test host server farm, that a second set of tests failed based on the output captured from the one or more tests run on the test host server farm.

In some embodiments, storing the test results data received from the test host server farm via the tests results service in the test results database may include storing timestamps indicating when one or more specific tests started and ended, information identifying a name of a specific host on which the one or more specific tests were run, information identifying a number of assertions that passed, and information identifying a number of assertions that failed.

In some embodiments, after sending the one or more local test execution commands to the test host server farm, the computing platform may receive, via the tests results service, test output data from the test host server farm. Subsequently, the computing platform may store the test output data received from the test host server farm via the tests results service in a test artifact cloud.

In some embodiments, prior to receiving the test execution request from the administrative computing device, the computing platform may receive at least a portion of the test specification details information from enterprise server architecture. Subsequently, the computing platform may store the at least the portion of the test specification details information in the test specification database.

In some embodiments, the computing platform may receive, via the communication interface, from a client computing device, a request for test results information. In response to receiving the request for the test results information from the client computing device, the computing platform may generate a test results report. Subsequently, the computing platform may send, via the communication interface, to the client computing device, the test results report.

In some instances, receiving the request for the test results information from the client computing device may include receiving the request for the test results information via a web dashboard provided to the client computing device. In some instances, receiving the request for the test results information from the client computing device may include receiving the request for the test results information via an application programming interface.

These features, along with many others, are discussed in greater detail below.

BRIEF DESCRIPTION OF THE DRAWINGS

The present disclosure is illustrated by way of example and not limited in the accompanying figures in which like reference numerals indicate similar elements and in which:

FIGS. 2A, 2B, and 2C depict an illustrative event sequence for conducting automated software testing using a centralized controller and one or more distributed test host servers in accordance with one or more example embodiments;

FIGS. 3A, 3B, 3C, 3D, and 3E depict another illustrative event sequence for conducting automated software testing using a centralized controller and one or more distributed test host servers in accordance with one or more example embodiments;

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized, and structural and functional modifications may be made, without departing from the scope of the present disclosure.

It is noted that various connections between elements are discussed in the following description. It is noted that these connections are general and, unless specified otherwise, may be direct or indirect, wired or wireless, and that the specification is not intended to be limiting in this respect.

Figure 1A:
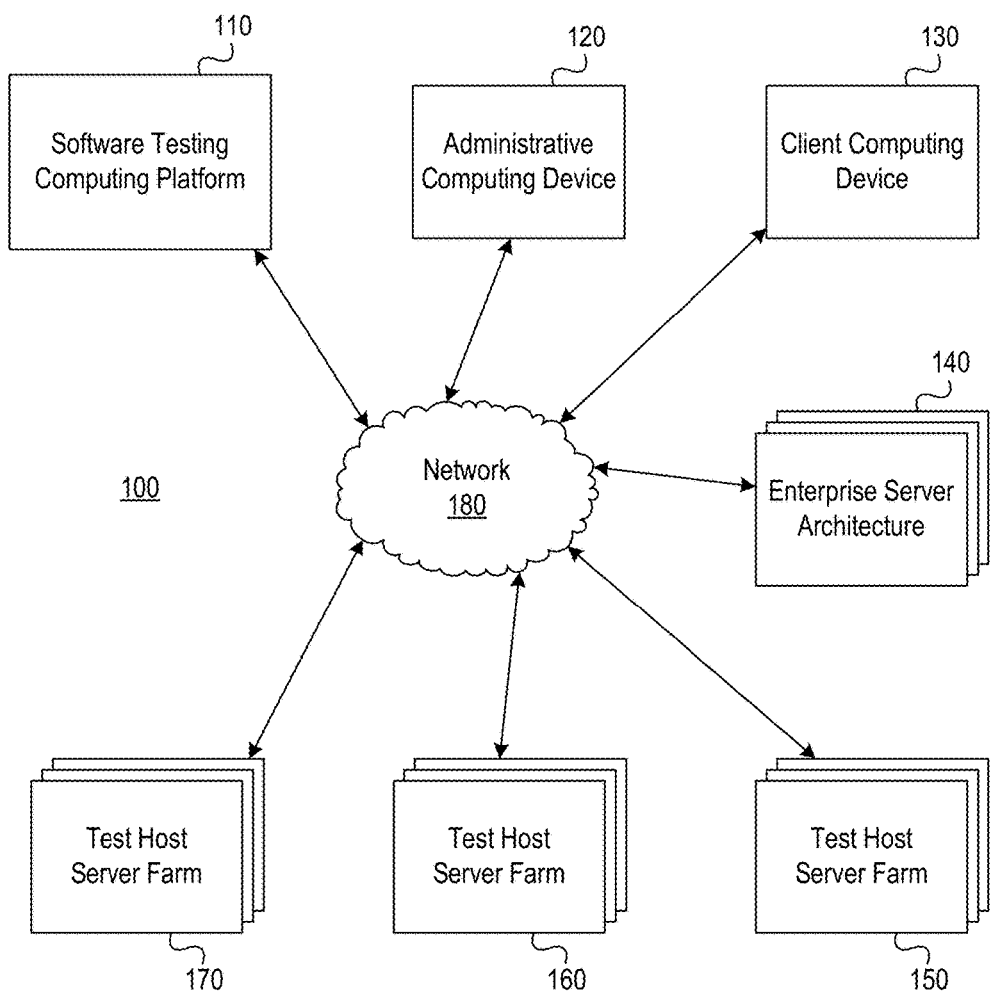
FIGS. 1A and 1B depict an illustrative computing environment for conducting automated software testing using a centralized controller and one or more distributed test host servers in accordance with one or more example embodiments.
Figure 1B:
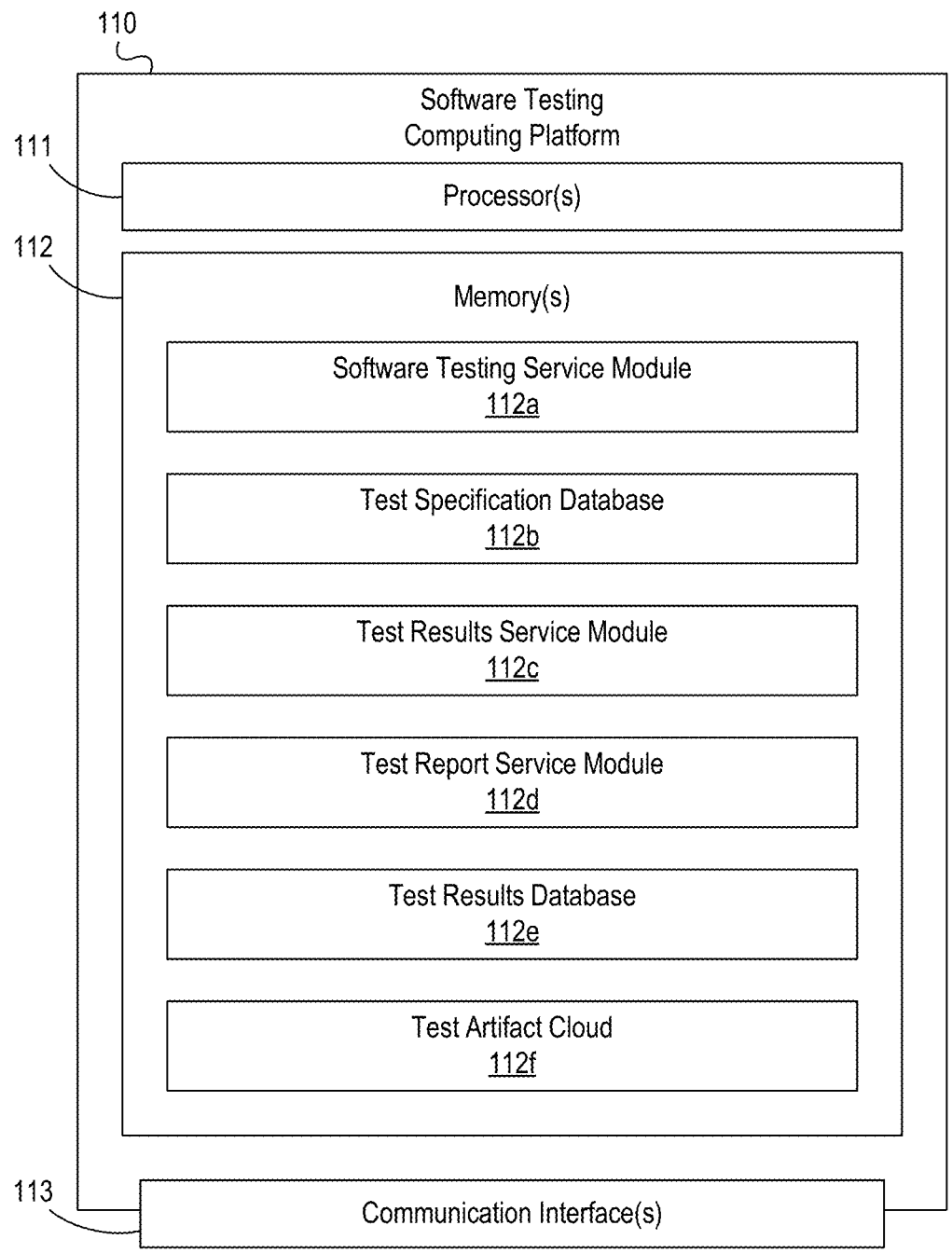

FIGS. 1A and 1B depict an illustrative computing environment for conducting automated software testing using a centralized controller and one or more distributed test host servers in accordance with one or more example embodiments. Referring to FIG. 1A, computing environment 100 may include one or more computing platforms, one or more computing devices, and various other computing infrastructure. For example, computing environment 100 may include software testing computing platform 110, administrative computing device 120, client computing device 130, enterprise server architecture 140, test host server farm 150, test host server farm 160, and test host server farm 170.

As illustrated in greater detail below, software testing computing platform 110 may include one or more computing devices configured to perform one or more of the functions described herein. For example, software testing computing platform 110 may include one or more computers (e.g., laptop computers, desktop computers, servers, server blades, or the like) configured to perform one or more of the functions described herein, as discussed in greater detail below.

Administrative computing device 120 may be configured to provide one or more interfaces that allow for configuration and management of one or more other computing devices and/or computer systems included in computing environment 100, such as one or more interfaces that allow for configuration and management of software testing computing platform 110. Client computing device 130 may be configured to provide one or more interfaces that allow for interaction with and use of one or more other computing devices and/or computer systems included in computing environment 100, such as one or more interfaces that allow for interaction with and use of software testing computing platform 110.

Enterprise server architecture 140 may include multiple server computers that are owned, operated, maintained, and/or otherwise used by an organization, such as an enterprise organization associated with software testing computing platform 110. For example, enterprise server architecture 140 may include one or more server computers that store and/or otherwise maintain enterprise applications (which may, e.g., be executed by and/or provided to one or more computing devices associated with enterprise users) and/or enterprise information (which may, e.g., be accessed and/or used by the enterprise applications and/or by the one or more computing devices associated the with enterprise users).

For example, enterprise server architecture 140 may include one or more computer systems that are configured to provide one or more portal interfaces to one or more client devices and/or configured to authenticate one or more client devices and/or users of such devices to such portal interfaces. For example, enterprise server architecture 140 may include a computer system configured to provide a customer portal, such as an online banking portal, to one or more customers of an organization, such as a financial institution, who may use one or more computing devices to access the portal and/or who may be authenticated to one or more portal user accounts by the computer system using various authentication techniques. In some instances, in addition to being configured to provide an online banking portal associated with a financial institution to one or more customers of the financial institution and/or their associated computing devices, the computer system (which may, e.g., be included in enterprise server architecture 140) also may be configured to provide a mobile banking portal associated with the financial institution to various customers of the financial institution and/or their associated mobile computing devices. Such portals may, for instance, provide customers of the financial institution with access to financial account information (e.g., account balance information, account statements, recent transaction history information, or the like) and/or may provide customers of the financial institution with menus, controls, and/or other options to schedule and/or execute various transactions (e.g., online bill pay transactions, person-to-person funds transfer transactions, or the like).

Additionally or alternatively, enterprise server architecture 140 may include one or more client account servers, which may be configured to store and/or maintain information associated with one or more client accounts. For example, the client account server(s) may be configured to store and/or maintain information associated with one or more financial accounts associated with one or more customers of a financial institution, such as account balance information, transaction history information, and/or the like. Additionally or alternatively, the client account server(s) may include and/or integrate with one or more client support servers and/or devices, such as one or more customer service representative devices used by one or more customer service representatives of an organization (which may, e.g., be a financial institution operating one or more computer systems in computing environment 100), to connect one or more customers of the organization with one or more customer service representatives of the organization via one or more telephone support sessions, chat support sessions, and/or other client support sessions.

Test host server farm 150, test host server farm 160, and test host server farm 170 may be distinct and physically separate data centers or other groupings of server computers that are operated by and/or otherwise associated with an organization, such as a financial institution. In addition, each of test host server farm 150, test host server farm 160, and test host server farm 170 may house a plurality of server computers and various other computers, network components, and devices. For example, each of test host server farm 150, test host server farm 160, and test host server farm 170 may include a plurality of server nodes that are made up of and/or otherwise include one or more servers and/or server blades, which may be monitored and/or controlled by software testing computing platform 110 and/or one or more other computing devices included in computing environment 100. Each server and/or server blade included in the plurality of server nodes associated with test host server farm 150, test host server farm 160, and test host server farm 170 may include one or more processors, memories, communication interfaces, storage devices, and/or other components.

Computing environment 100 also may include one or more networks, which may interconnect one or more of software testing computing platform 110, administrative computing device 120, client computing device 130, enterprise server architecture 140, test host server farm 150, test host server farm 160, and test host server farm 170. For example, computing environment 100 may include network 180, which may include one or more public networks, one or more private networks, and/or one or more sub-networks (e.g., local area networks (LANs), wide area networks (WANs), or the like).

In one or more arrangements, administrative computing device 120, client computing device 130, and other computing devices included in computing environment 100 may be any type of computing device capable of receiving a user interface, receiving input via the user interface, and communicating the received input to one or more other computing devices. For example, administrative computing device 120 and client computing device 130 may, in some instances, be and/or include server computers, desktop computers, laptop computers, tablet computers, smart phones, or the like and may include one or more processors, memories, communication interfaces, storage devices, and/or other components. As noted above, and as illustrated in greater detail below, any and/or all of the computing devices included in computing environment 100 may, in some instances, be special-purpose computing devices configured to perform specific functions.

Referring to FIG. 1B, software testing computing platform 110 may include one or more processors 111, one or more memories 112, and one or more communication interfaces 113. A data bus may interconnect the one or more processors 111, the one or more memories 112, and the one or more communication interfaces 113. Communication interface 113 may be a network interface configured to support communication between software testing computing platform 110 and one or more networks (e.g., network 180 or the like). Memory 112 may include one or more program modules having instructions that when executed by processor 111 cause software testing computing platform 110 to perform one or more functions described herein and/or one or more databases and/or other libraries that may store and/or otherwise maintain information which may be used by such program modules and/or processor 111.

In some instances, the one or more program modules and/or databases may be stored by and/or maintained in different memory units of software testing computing platform 110 and/or by different computing devices that may form and/or otherwise make up software testing computing platform 110. For example, memory 112 may have, store, and/or include a software testing service module 112a, a test specification database 112b, a test results service module 112c, a test report service module 112d, a test results database 112e, and a test artifact cloud 112f. Software testing service module 112a may include hardware components and/or executable instructions that enable and/or cause software testing computing platform 110 to provide a software testing service, such as the test master service discussed below. Test specification database 112b may store test specification details and/or other information associated with conducting software application testing. Test results service module 112c may include hardware components and/or executable instructions that enable and/or cause software testing computing platform 110 to provide a test results service, such as the test results service discussed below. Test report service module 112d may include hardware components and/or executable instructions that enable and/or cause software testing computing platform 110 to provide a test reporting service, such as the test report service discussed below. Test results database 112e may store test results data and/or other information that may result from and/or be determined based on conducting software application testing. Test artifact cloud 112f may store test output data and/or other information that may be captured during software application testing.

Figure 1C:
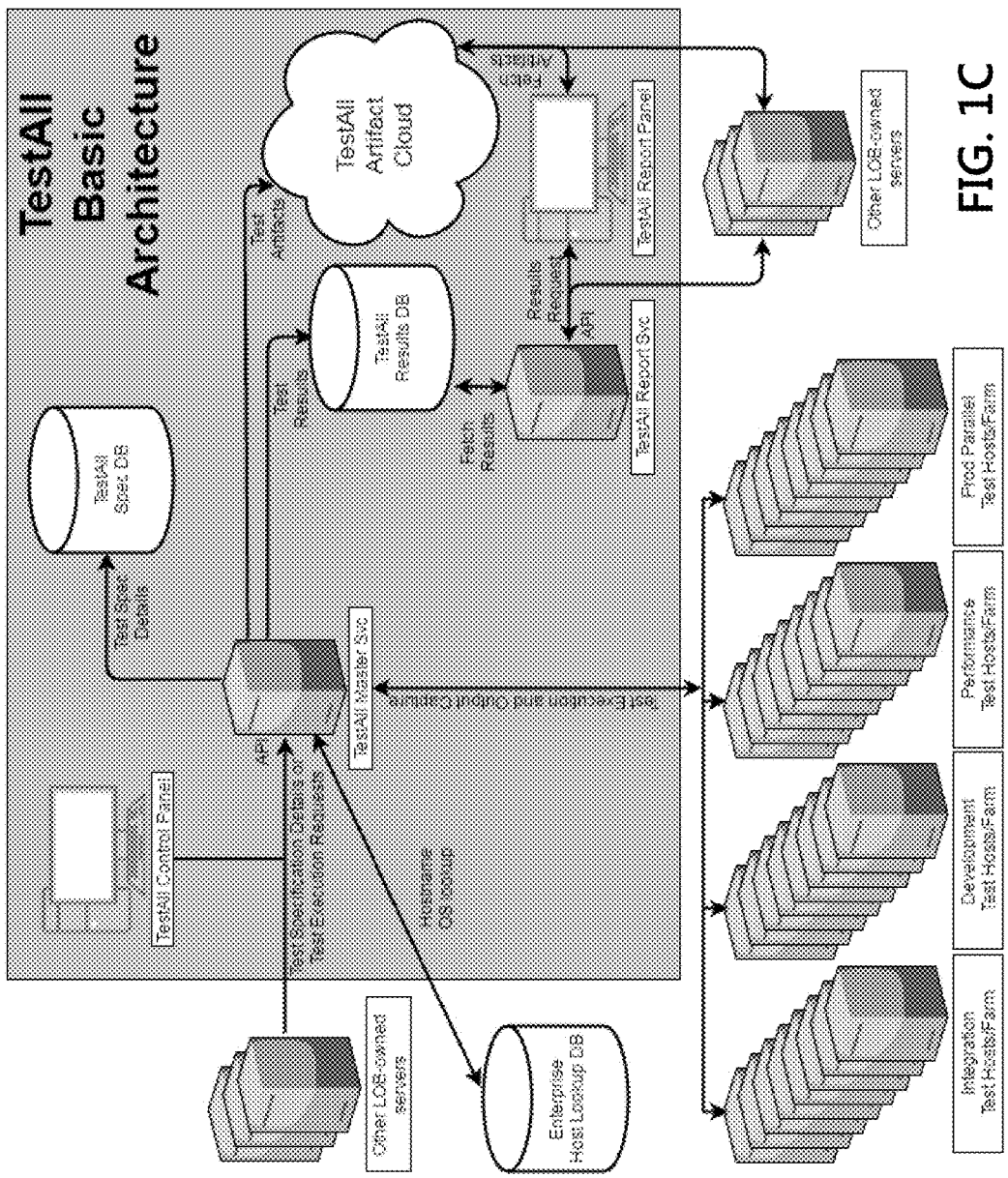
FIGS. 1C and 1D depict additional illustrative computing environments for conducting automated software testing using a centralized controller and one or more distributed test host servers in accordance with one or more example embodiments.
Figure 1D:
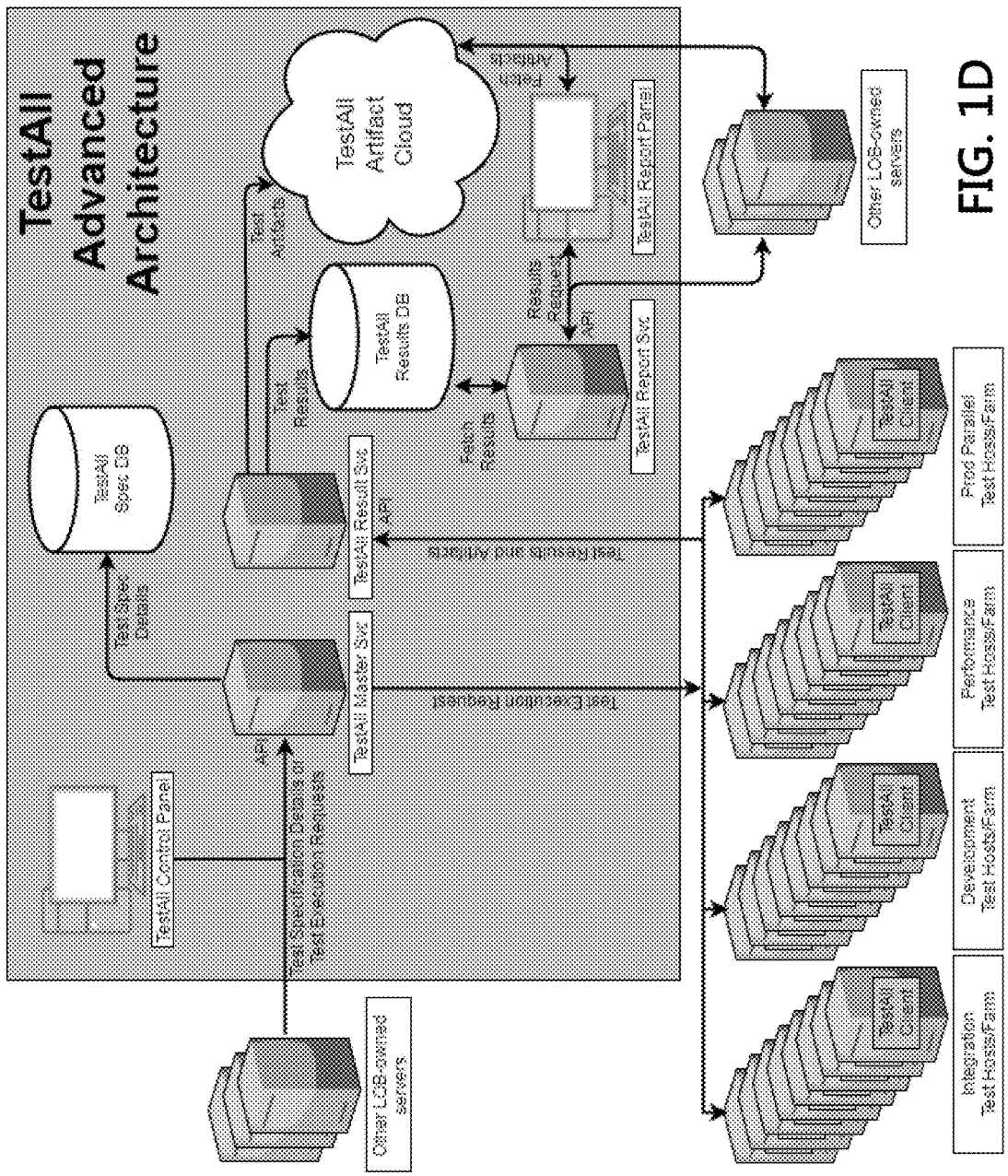

FIGS. 1C and 1D depict additional illustrative computing environments for conducting automated software testing using a centralized controller and one or more distributed test host servers in accordance with one or more example embodiments. In one or more arrangements, software testing computing platform 110 and/or the other elements of computing environment 100 discussed above in connection with FIGS. 1A and 1B may be configured in the manner illustrated in FIGS. 1C and 1D and/or otherwise be arranged to provide the architectures illustrated in FIGS. 1C and 1D and discussed in greater detail below.

In one or more arrangements, the architectures illustrated in FIGS. 1C and 1D may implement and/or provide a platform-agnostic and technology-agnostic test execution harness. In particular, these example architectures may provide a clean interface (which may, e.g., be provided as a user interface (UI) and/or as an application programming interface (API)) for scheduling tests, maintaining a centralized results repository to store test results and/or provide reporting services associated with such tests. In addition, various aspects may be implemented without requiring developer and/or tester teams to change the one or more testing tool(s) that they may be currently using.

In one or more arrangements, the architectures illustrated in FIGS. 1C and 1D may be used to launch a test remotely on a target host, collect and analyze the output to determine pass and/or fail assertion counts, and store the results. As discussed below, this may be achieved with multiple levels of complexity depending on different features. Some aspects of the disclosure facilitate the execution of tests that meet three criteria: (1) the test can be launched from a command line/system call; (2) the test can write information to standard-out ("stdout"); and (3) the test owner can provide two simple regular expressions ("regex") or XPath expressions ("XPath") for use by the test architectures in analyzing the output generated in testing to identify passing and failing assertions. With respect to the first criterion, many testing tools can be launched from a command line/system call. The exact command line or system call may vary depending on the operating system of the host where test execution occurs. With respect to the second criterion, many testing tools can write information to standard-out or this functionality can be simulated. Almost all testing tools generate some form of output, like a log of all of the interactions with the application under test ("AUT") and messages regarding the pass or fail status of each assertion. If that information is not already written to stdout by a particular testing tool, adding a single "print( )" statement in the core logic of the test may cause the tool to write to stdout. Alternatively, some tools may capture those messages local file (e.g., in XML or in another format) which can be written to stdout by the testing tool at the end of test execution by using 'cat <filename>' (Unix) or 'type <filename>' (Windows) or similar. With respect to the third criterion, many testing tools provide structured test output. For example, for a test where the lines of output begin with the string "Pass:" or "Fail:" (followed by some details of the scenario that passed) the regex "^Pass:*" and "^Fail:*" would be correct. Given the use of XPath in test output and the flexibility of regex, most all structured output can be matched to an appropriate set of XPath expressions or pair of pass/fail regex strings.

In one or more arrangements, the architectures illustrated in FIGS. 1C and 1D may involve deploying one or more components. For instance, the architecture may utilize enterprise components, such as a host lookup facility (e.g., a service or database) that identifies the operating system running on any testing host. In addition, the architecture may utilize test hosts and/or farms where tests may be executed. The architecture also may utilize a "TestAll Spec Database" where developers and/or testers may provide details of each test to be run by the testing service. These details may include a unique logical name of the test, unique application name(s)/ID(s) of application(s) tested by the automated test, command line details to launch the test, pass/fail regex strings, and a default host/class where the test should execute. The architecture also may utilize a "TestAll Artifact Cloud" key/value object storage platform to serve as the repository of all test execution artifacts, including test output, screen shots, and/or the like.

In some arrangements, the architecture also may utilize a "TestAll Result Database" to store test execution details: test name, unique test run ID, application name(s)/ID(s), timestamps (test scheduled, test started, test completed), hostname where execution occurred, key(s) to obtain test execution artifacts, assertion counts (passed, failed) and identifier of the person and/or application that submitted the test execution request to the testing service. The architecture also may utilize a "TestAll Master Service" that accepts test execution requests via API. The API signature may include the unique name of the test to be run, a start-after time (e.g., for use when scheduling tests earlier than desired execution time) and testing host/class (e.g., for use when overriding the default listed in the "Test Spec" database). The "TestAll Master" may also include an API for providing programmatic updates to the "Test Spec" data.

In some arrangements, the architecture also may include a "TestAll Report Service" that accepts requests for test results data via API. The API signature may include search parameters including test name, unique test run ID, application name(s)/ID(s) and timestamps as search criteria. The service may return the matching rows from the "Test Result" database. In some instances, this service also may generate on-demand document-formatted reports and/or the like. The architecture also may include a "TestAll Control Panel" that provides a user interface for developers and/or testers to create or update "Test Spec" details and to submit on-demand test execution requests. The architecture also may include a "TestAll Report Panel" that provides a user interface for developers and/or testers to view test results based on flexible search criteria (which may, e.g., be specified in the "TestAll Control Panel"). The results may include links to viewable artifacts stored in the "TestAll Artifact" repository (e.g., test output, screen shots, and/or the like).

In some arrangements, the architecture also may include a "TestAll Results Service" that provides a clean API for TestAll Clients to submit test results and artifacts for storage in the TestAll Results Database and TestAll Artifact Cloud. In addition, the architecture may include a "TestAll Client" that provides a daemon process which may run on each test host/farm and performs test execution, post-processing, and results submission tasks.

Referring to FIG. 1C, a "basic architecture" is illustrated and a related process flow is described below. In a Test Setup phase, users may submit test specifications to the TestAll Master Service via an API that can be accessed from the TestAll Control Panel or from other tools. In a Test Execution Request Submission phase, a request for test execution may be submitted to the TestAll Master Service via an API that can be accessed from the TestAll Control Panel. In some instances, tests execution requests may be submitted via the API from other systems. For example, upon successful distribution of a new application build to a testing environment, a build system may call the API to automatically launch the associated tests. In another example, a development or testing team wanting to re-run tests may do so from their own quality assurance dashboard which would call the TestAll Master Service API. In another example, for automated daily unattended test reruns, a scheduled script (cron, autosys, and/or the like) may call the TestAll Master Service API.

In a Test Execution phase, after receiving a test execution request, the TestAll Master Service may pull information about the test from the TestAll Spec DB, check the operating system of the target host from the host lookup facility and then generate the correct command to launch the test remotely on the target testing host. The command may be crafted such that the standard output is redirected or piped to a local file on the TestAll Master Service server. Upon completion of the test execution, the TestAll Master Server may pass the output through a post-parser that uses the regular expressions from the test's entry in the TestAll Spec DB to determine the number of passed and failed assertions in the test.

In a Test Results and Artifacts Storage phase, after post-processing is complete, the TestAll Master Server may post the test output in the TestAll Artifact Cloud and store test results in the TestAll Results Database. In a Test Results Reporting phase, test results may be queried using the TestAll Report Service API using various tools (e.g., test results dashboards) or using the TestAll Report Panel.

The architecture presented in FIG. 1C presents a number of technical advantages. For instance, this approach may be easy to implement. In addition, the test execution hosts might not require TestAll software to be installed locally. Some difficulties that may be presented by this approach, however, include the load on the TestAll Master Service. In addition, if different tests need to run under different usernames (e.g., service IDs), it may be necessary to maintain information in the TestAll Spec Database regarding the correct username (service ID) for each test to run under and the test owners might have to ensure that the appropriate access credentials are established and managed for TestAll to be able to run processes on those hosts. In some instances, it also may be challenging for the TestAll Master Service to manage the number of concurrent tests running on each host. This may lead to hosts becoming overwhelmed by concurrent execution requests and multiple Windows-based UI tests from running concurrently and causing clash. In addition, the test artifact that flows into the TestAll Artifact Cloud might be limited to the test output in some instances.

Referring to FIG. 1D, an "advanced architecture" is illustrated and a related process flow is described below. In the advanced architecture, each test execution host may run a daemon ("TestAll Client") process which manages local test execution, post-processing and results submission. The Test Setup phase and the Test Execution Request Submission phase may proceed in the same manner as discussed above with respect to the basic architecture.

In a Test Execution phase, after receiving a test execution request, the TestAll Master Service may send a message to the TestAll Client on the target host/farm where that test needs to run. The message may contain host command, execution username/service ID and pass/fail regex details from the TestAll Spec DB. The TestAll Client may manage a queue of tests requiring execution and may only run the number of tests appropriate for that host (e.g., based on criteria such as available resources or a maximum threshold defined by the host owner). The TestAll Client may check the operating system on the local host (e.g., no need to query a host lookup service) and may generate the correct command to launch the test locally. The command may be crafted such that the standard output is redirected or piped to a local file on the test host. If the required username/service ID does not match the username/service ID that is running the TestAll Client itself, then the TestAll Client may craft the command accordingly to allow the test to run under the required execution username/service ID. Upon completion of the test execution, the TestAll Client may pass the output through a post-parser that uses the regular expressions to determine the number of passed and failed assertions in the test.

In a Test Results and Artifacts Storage phase, after post-processing is complete, the TestAll Client may post the test output in the TestAll Artifact Cloud and store test results in the TestAll Results Database. This storage may, in some instances, be performed via a results submission service, rather than direct database access. The Test Results Reporting phase may proceed in the same manner as discussed above with respect to the basic architecture.

The architecture presented in FIG. 1D presents a number of technical advantages. For instance, in this approach, the TestAll client may be setup to launch upon system boot under the correct username/service ID for tests run on that host. Thus, if the host does not need to run tests requiring multiple usernames/service IDs, no further credential management might be needed. In addition, managing the number of concurrent tests run on any given host may be managed by the TestAll Client, which may be advantageous. In some instances, however, it may be more challenging to implement and the test execution hosts may require TestAll software to be installed locally. In some instances, it may be necessary to manage the test execution queues such that if a TestAll Client is rebooted, the test execution queue on that host can be recovered. Similarly, there may be a need for a facility to cancel tests that were already scheduled and reside in the TestAll Client's queue.

In some instances, it may be important that the version of the application under test ("AUT") is carefully considered. For example, if tests are intended to run on a particular application version, the tests should not be allowed to launch if that version is missing on the test host. One example: The current test execution hosts have version 2.01 of an application. An automation platform builds version 2.02 of HelloWorld and initiates deployment of that version to the testing environment, and then immediately calls the TestAll API to run the tests of HelloWorld. This may create a race condition in which TestAll could begin to launch the tests before version 2.02 is available on the hosts. (The delay of version 2.02 may occur in a software deployment fabric, for example.) It may be desired for the tests to not run until version 2.02 is present. This may be solved in the following way: If the test requestor (a person or a system which calls the TestAll Master Service execution API) wants to ensure that the test is only run on a particular version of the software, they may specify that in the API call. The installed version of HelloWorld may be verified before launching the tests, and if the wrong version is present then the test would not run. Implementing this may be done by checking software versions (or for the mechanism to check a particular software's version to be part of the TestAll Spec DB data supplied in the test specification details). In some instances, this mechanism may be implemented in the Advanced Architecture using the TestAll Client.

In some instances, in both the Basic Architecture and Advanced Architecture, it may be necessary to enforce a maximum time limit for text execution and to kill "zombie" tests (any tests that overrun the maximum time). The maximum time may have a default amount, and may be overridden by providing a value in the test specification details stored in the TestAll Spec DB. Enforcing the maximum time may be achieved by using a timeout wrapper command that kills the child process in which the test runs. In the Advanced Architecture model, this may be done using the TestAll Client to enforce the maximum execution time.

In some instances, when running large numbers of automated tests across large numbers of testing hosts, specifying exact hostnames in the test specification details stored in the TestAll Spec DB might not be preferred. Rather, it may be better to have clusters of hosts which are members of a test farm, and a test may be executed on any member of the appropriate farm. TestAll may leverage existing cloud/FaaS infrastructure to handle either specific hostname or farm name in the test specification details.

In some instances, unattended execution of Windows-based user interface tests may be challenging because the host where the test is executed must have the screen, keyboard and mouse unlocked (no screen saver or lock screen). This issue might need to be addressed and resolved before TestAll may launch unattended UI tests on Windows hosts. In some instances, this issue may be resolved by establishing a protected class of hosts with the lock security policy disabled in a controlled environment acceptable to the organization and/or its information security group.

Figure 2A:
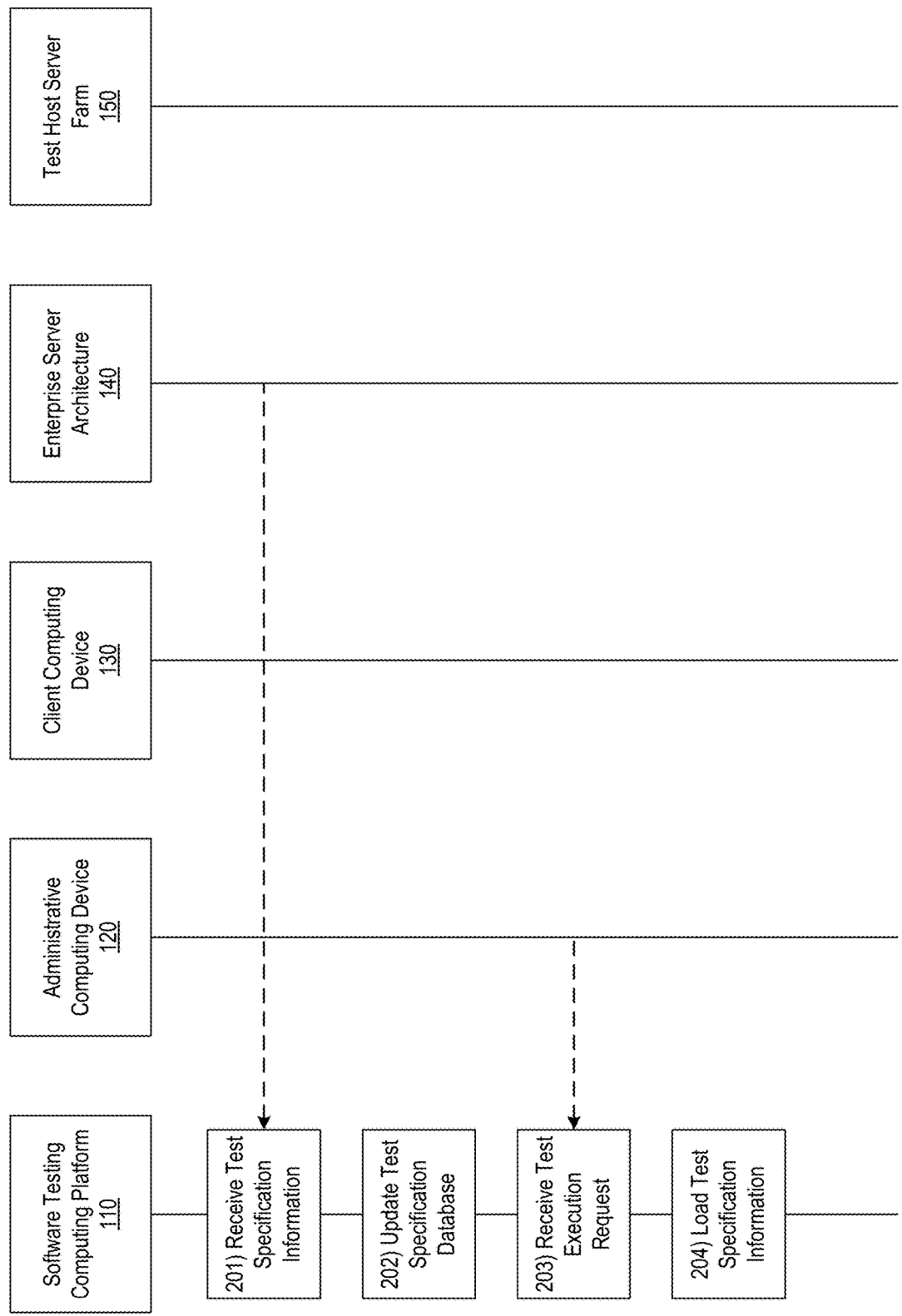
Figure 2B:
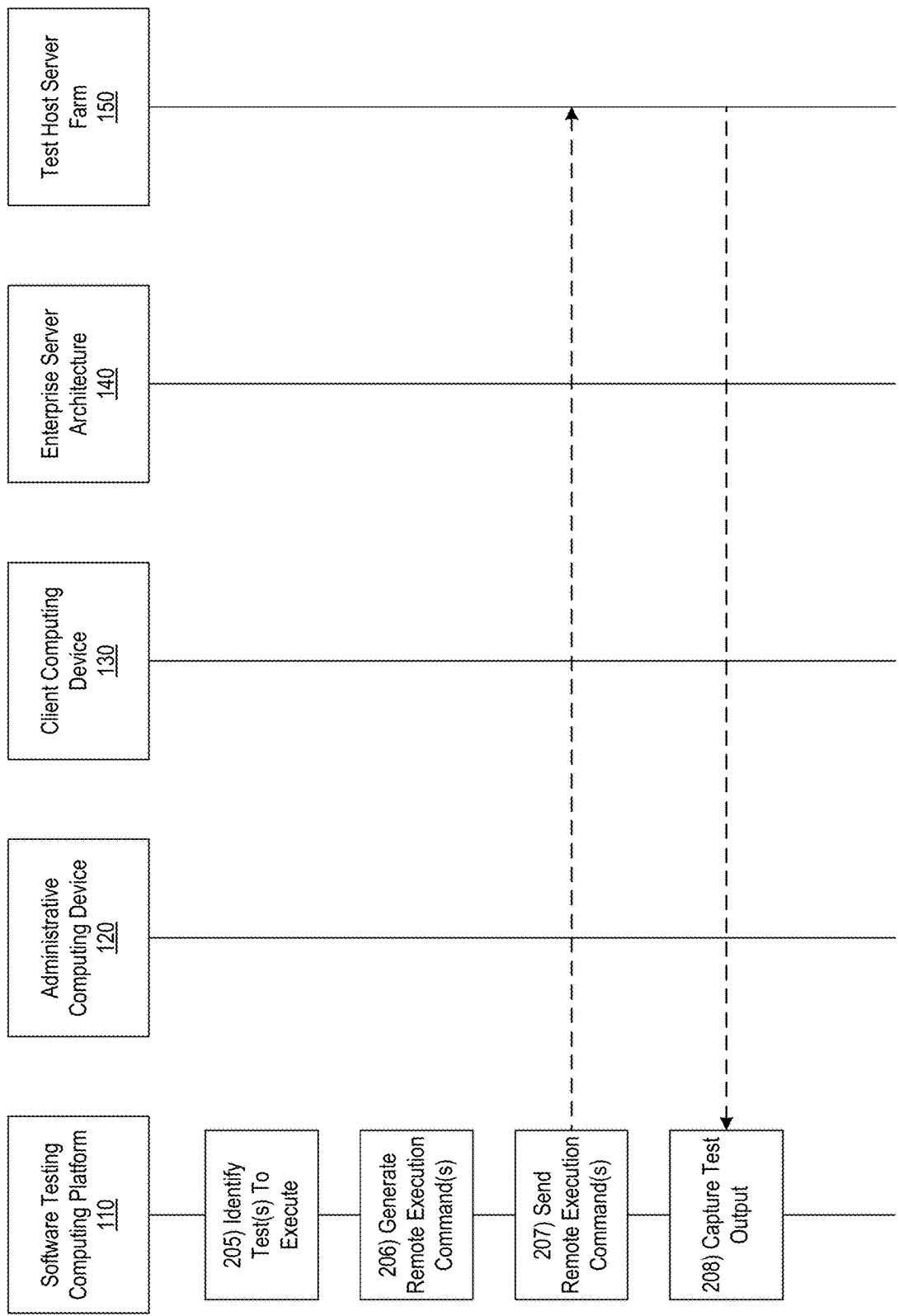

FIGS. 2A, 2B, and 2C depict an illustrative event sequence for conducting automated software testing using a centralized controller and one or more distributed test host servers in accordance with one or more example embodiments. The example event sequence depicted in FIGS. 2A, 2B, and 2C may, for instance, illustrate a series of steps executed in connection with the basic architecture discussed above.

Referring to FIG. 2A, at step 201, software testing computing platform 110 may receive test specification details information (e.g., from enterprise server architecture 140 and/or from one or more other sources). For example, at step 201, prior to receiving a test execution request, software testing computing platform 110 may receive at least a portion of test specification details information from enterprise server architecture (e.g., enterprise server architecture 140). The test specification details information received by software testing computing platform 110 from enterprise server architecture 140 may, for instance, include: information specifying one or more specific, different tests to run for one or more specific, different types of applications; information specifying one or more specific hosts and/or specific types of hosts those tests should be run on; information specifying how to launch those tests (e.g., information specifying command line functions, arguments, parameters, and/or other launch information); and/or the like. The tests that may be defined in the test specification details information received by software testing computing platform 110 from enterprise server architecture 140 and/or subsequently run by software testing computing platform 110 and/or associated testing architecture may include any type of software application tests, such as security-related tests, server-side tests and/or service-based architecture tests, fat-client and/or heavy-user-interface tests, user-application tests, web-based application tests, and/or other types of tests.

At step 202, software testing computing platform 110 may update a test specification database based on the test specification details information received from enterprise server architecture 140. For example, at step 202, software testing computing platform 110 may store the at least the portion of the test specification details information (which may, e.g., be received from enterprise server architecture 140) in a test specification database (e.g., test specification database 112b).

At step 203, software testing computing platform 110 may receive a test execution request (e.g., from administrative computing device 120, identifying a particular application to be tested and a particular environment for conducting such testing). For example, at step 203, software testing computing platform 110 may receive, via a communication interface (e.g., communication interface 113), from an administrative computing device (e.g., administrative computing device 120), a test execution request. In some embodiments, receiving the test execution request from the administrative computing device may include receiving information identifying a specific software application to be tested in a specific computing environment. For example, in receiving the test execution request from the administrative computing device (e.g., administrative computing device 120), software testing computing platform 110 may receive information identifying a specific software application to be tested in a specific computing environment.

Figure 4:
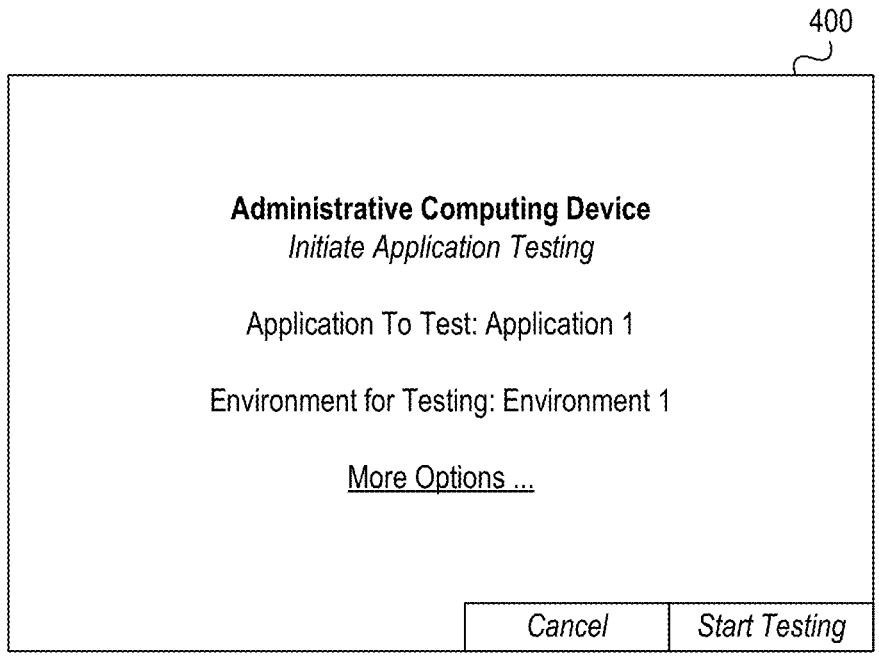
FIGS. 4, 5, 6, and 7 depict example graphical user interfaces for conducting automated software testing using a centralized controller and one or more distributed test host servers in accordance with one or more example embodiments.

In some instances, in receiving the test execution request from administrative computing device 120, software testing computing platform 110 may receive a message and/or other information from administrative computing device 120 corresponding to one or more selections made via one or more graphical user interfaces presented by administrative computing device 120, such as graphical user interface 400, which is depicted in FIG. 4. As seen in FIG. 4, graphical user interface 400 may include one or more user interface elements enabling a user of administrative computing device 120 to specify a particular application to be tested and a particular environment for testing the application, specify other options associated with the testing, and/or initiate the test execution request.

At step 204, software testing computing platform 110 may load test specification details information from a test specification database based on the test execution request. For example, at step 204, software testing computing platform 110 may retrieve, from a test specification database (e.g., test specification database 112b), test specification details information based on the test execution request received from the administrative computing device (e.g., administrative computing device 120).

Referring to FIG. 2B, at step 205, software testing computing platform 110 may identify one or more tests to execute based on the test specification details information and the test execution request. For example, at step 205, software testing computing platform 110 may identify one or more tests to execute based on the test specification details information retrieved from the test specification database (e.g., test specification database 112b) and the test execution request received from the administrative computing device (e.g., administrative computing device 120). Software testing computing platform 110 may, for instance, identify the one or more tests to execute by matching information from the test execution request (which may, e.g., specify a particular application to be tested in a particular environment) with corresponding test specification details information (which may, e.g., specify what tests should be run to facilitate testing of the particular application, where such tests should be run, how such tests should be launched, and/or the like) so as to initiate and/or complete testing of the specified application in the specified environment.

At step 206, software testing computing platform 110 may generate one or more remote execution commands directing test host server farm 150 to execute the one or more identified tests. For example, at step 206, software testing computing platform 110 may generate one or more remote test execution commands directing a test host server farm (e.g., test host server farm 150) to execute the one or more tests identified based on the test specification details information retrieved from the test specification database (e.g., test specification database 112b) and the test execution request received from the administrative computing device (e.g., administrative computing device 120). In addition, generating the one or more remote test execution commands may include constructing one or more command line instructions to be executed by the test host server farm and inserting the one or more command line instructions to be executed by the test host server farm into the one or more remote test execution commands. For example, in generating the one or more remote test execution commands (e.g., at step 206), software testing computing platform 110 may construct one or more command line instructions to be executed by the test host server farm (e.g., test host server farm 150). Then, software testing computing platform 110 may insert the one or more command line instructions to be executed by the test host server farm (e.g., test host server farm 150) into the one or more remote test execution commands. In this way, software testing computing platform 110 may remotely execute various software application tests on test host server farm 150 (e.g., by constructing the command line, launching various tests on a particular application, and then capturing and processing the output of such tests).

At step 207, software testing computing platform 110 may send the one or more remote execution commands to test host server farm 150. For example, at step 207, software testing computing platform 110 may send, via the communication interface (e.g., communication interface 113), to the test host server farm (e.g., test host server farm 150), the one or more remote test execution commands directing the test host server farm (e.g., test host server farm 150) to execute the one or more tests identified based on the test specification details information retrieved from the test specification database (e.g., test specification database 112b) and the test execution request received from the administrative computing device (e.g., administrative computing device 120).

At step 208, software testing computing platform 110 may remotely capture test output from test host server farm 150.

For example, at step 208, after sending the one or more remote test execution commands to the test host server farm (e.g., test host server farm 150), software testing computing platform 110 may remotely capture test output from the test host server farm (e.g., test host server farm 150). In remotely capturing test output from test host server farm 150, software testing computing platform 110 may capture raw test output and/or may process the raw test output. For instance, software testing computing platform 110 may harvest and/or otherwise capture what is occurring on test host server farm 150 as the one or more tests are being executed and may interrogate data received from test host server farm 150 to determine whether specific tests are passing or failing. In addition, software testing computing platform 110 may write results data to a results database (e.g., test results database 112e).

Figure 5:
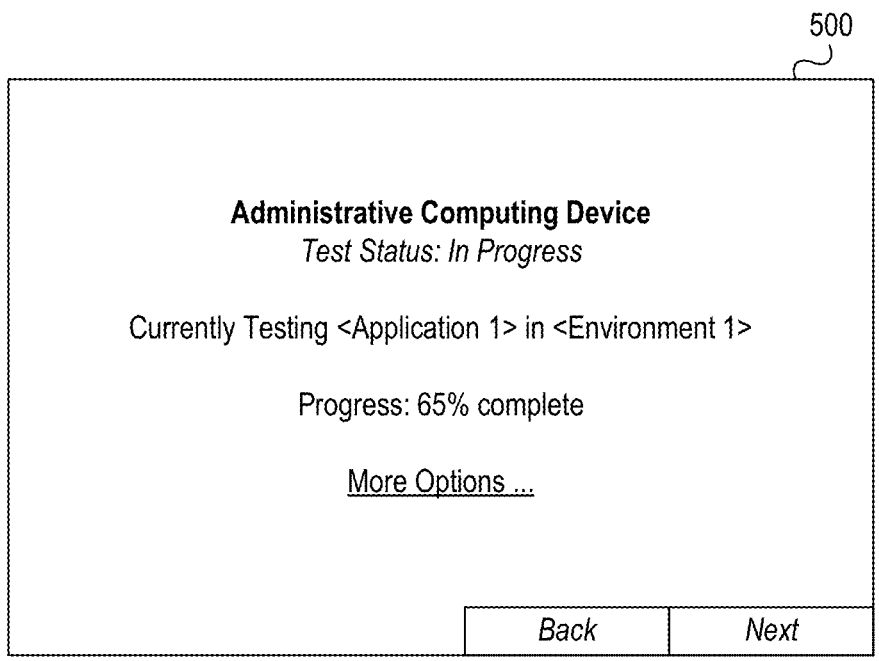

In some instances, while remotely capturing test output from test host server farm 150, software testing computing platform 110 may generate one or more user interfaces having status information indicative of the progress of the testing. In addition, software testing computing platform 110 may send such user interfaces to administrative computing device 120 and/or otherwise cause administrative computing device 120 to display such user interfaces. For example, while remotely capturing test output from test host server farm 150, software testing computing platform 110 may generate and send to administrative computing device 120 a graphical user interface similar to graphical user interface 500, which is depicted in FIG. 5. As seen in FIG. 5, graphical user interface 500 may include status information identifying the application currently being tested and the environment in which the application is being tested, progress information identifying how far along the testing is, and/or other user interface elements enabling a user of administrative computing device 120 to specify other options associated with the testing.

In some embodiments, the one or more command line instructions to be executed by the test host server farm may cause the test host server farm to run one or more tests that write pass-fail output associated with the one or more tests to a console. For example, the one or more command line instructions to be executed by the test host server farm (which may, e.g., be generated and sent by software testing computing platform 110 to test host server farm 150) may cause the test host server farm (e.g., test host server farm 150) to run one or more tests that write pass-fail output associated with the one or more tests to a console. For instance, the one or more command line instructions to be executed by the test host server farm (which may, e.g., be generated and sent by software testing computing platform 110 to test host server farm 150) may cause the test host server farm (e.g., test host server farm 150) to run one or more tests that write pass-fail output associated with the one or more tests to stdout, as discussed in the examples above.

In some embodiments, remotely capturing the test output from the test host server farm may include capturing the pass-fail output associated with the one or more tests from the console. For example, in remotely capturing the test output from the test host server farm (e.g., test host server farm 150), software testing computing platform 110 may capture the pass-fail output associated with the one or more tests from the console. For instance, software testing computing platform 110 may capture the pass-fail output associated with the one or more tests from the console on test host server farm 150 using one or more regular expressions and/or other output capture tools, as discussed in the examples above.

In some embodiments, remotely capturing the test output from the test host server farm may include processing the test output captured from the test host server farm to produce test results data. For example, in remotely capturing the test output from the test host server farm (e.g., test host server farm 150), software testing computing platform 110 may process the test output captured from the test host server farm (e.g., test host server farm 150) to produce test results data. The test results data may, for instance, include information identifying specific tests that passed, specific tests that failed, specific hosts that executed specific tests, and/or other information associated with the testing.

In some embodiments, processing the test output captured from the test host server farm to produce the test results data may include determining that a first set of tests passed based on the test output captured from the test host server farm and determining that a second set of tests failed based on the test output captured from the test host server farm. For example, in processing the test output captured from the test host server farm (e.g., test host server farm 150) to produce the test results data, software testing computing platform 110 may determine that a first set of tests passed based on the test output captured from the test host server farm (e.g., test host server farm 150) and may determine that a second set of tests failed based on the test output captured from the test host server farm (e.g., test host server farm 150).

Referring to FIG. 2C, at step 209, software testing computing platform 110 may store test results data. For example, at step 209, software testing computing platform 110 may store test results data based on remotely capturing the test output from the test host server farm (e.g., test host server farm 150). Software testing computing platform 110 may, for instance, store test results in test results database 112e and may capture and/or store artifacts in test artifact cloud 112f. The test results also may, for instance, include timestamps indicating when particular tests started and/or ended, the names of the hosts on which particular tests ran, how many assertions passed and/or failed, and/or other information associated with the testing.

In some embodiments, storing the test results data based on remotely capturing the test output from the test host server farm may include storing results information in a test results database and storing test artifacts in a test artifact cloud. For example, in storing the test results data based on remotely capturing the test output from the test host server farm (e.g., test host server farm 150), software testing computing platform 110 may store results information in a test results database (e.g., test results database 112e) and may store test artifacts in a test artifact cloud (e.g., test artifact cloud 112f).

In some embodiments, storing the results information in the test results database may include storing timestamps indicating when one or more specific tests started and ended, information identifying a name of a specific host on which the one or more specific tests were run, information identifying a number of assertions that passed, and information identifying a number of assertions that failed. For example, in storing the results information in the test results database (e.g., test results database 112e), software testing computing platform 110 may store timestamps indicating when one or more specific tests started and ended on test host server farm 150, information identifying a name of a specific host associated with test host server farm 150 on which the one or more specific tests were run, information identifying a number of assertions that passed during the testing executed on test host server farm 150, information identifying a number of assertions that failed during the testing executed on test host server farm 150, and/or other information associated with the testing executed on test host server farm 150.

Figure 6:
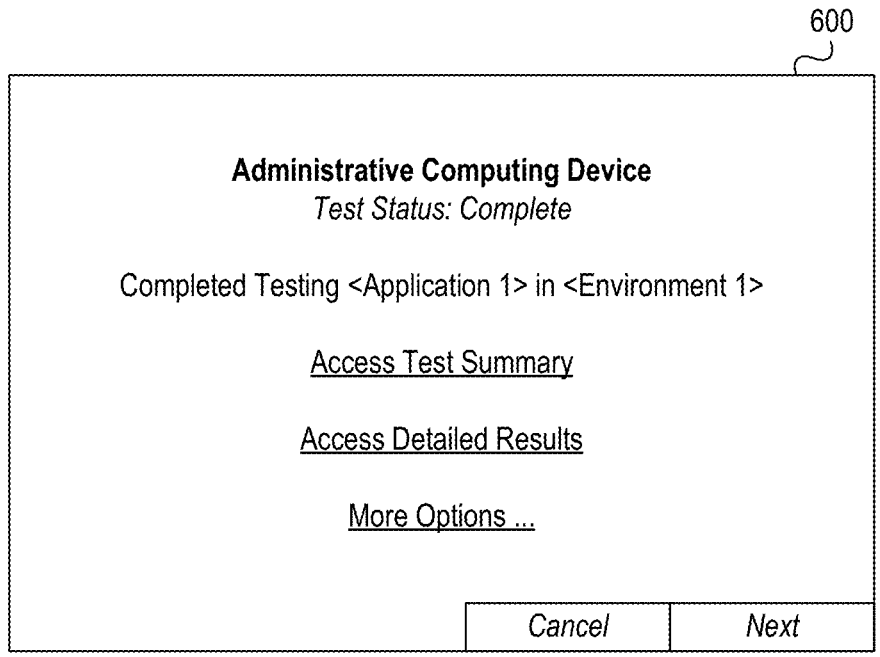
Figure 7:
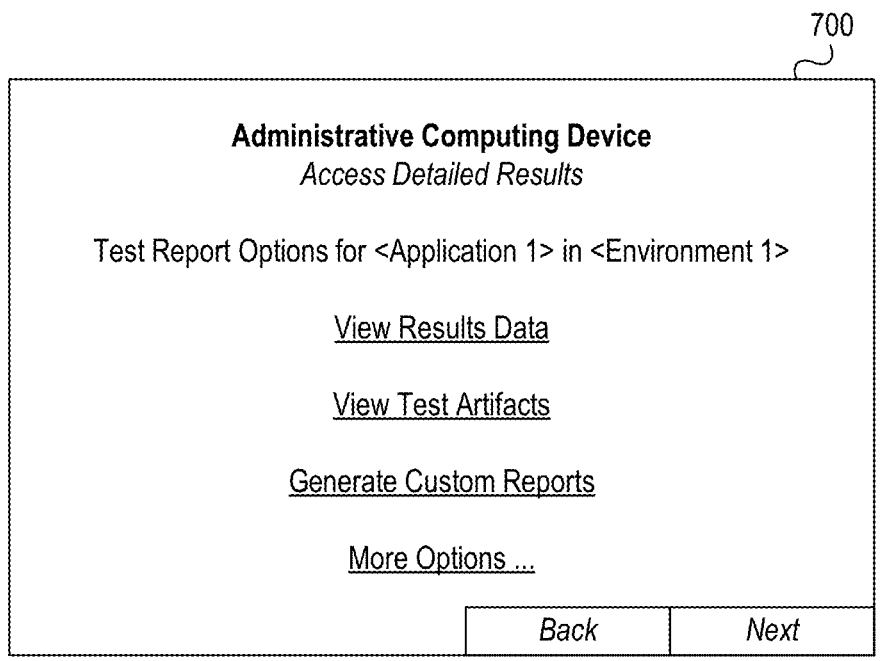

At step 210, software testing computing platform 110 may receive a report request (e.g., from client computing device 130). For example, at step 210, software testing computing platform 110 may receive, via the communication interface (e.g., communication interface 113), from a client computing device (e.g., client computing device 130), a request for test results information. In some instances, in receiving the report request from client computing device 130, software testing computing platform 110 may receive a message and/or other information from client computing device 130 corresponding to one or more selections made via one or more graphical user interfaces presented by client computing device 130, such as graphical user interface 600, which is depicted in FIG. 6, and/or graphical user interface 700, which is depicted in FIG. 7. As seen in FIG. 6, graphical user interface 600 may include one or more user interface elements enabling a user of client computing device 130 to access a test summary report associated with the application testing controlled by software testing computing platform 110, access detailed test results associated with the application testing controlled by software testing computing platform 110, and/or access other options associated with the application testing controlled by software testing computing platform 110. As seen in FIG. 7, graphical user interface 700 may include one or more user interface elements enabling a user of client computing device 130 to view raw test results data associated with the application testing controlled by software testing computing platform 110, view test artifacts associated with the application testing controlled by software testing computing platform 110, generate custom reports associated with the application testing controlled by software testing computing platform 110, and/or access other options associated with the application testing controlled by software testing computing platform 110.

In some embodiments, receiving the request for the test results information from the client computing device may include receiving the request for the test results information via a web dashboard provided to the client computing device. For example, in receiving the request for the test results information from the client computing device (e.g., client computing device 130), software testing computing platform 110 may receive the request for the test results information via a web dashboard provided to the client computing device (e.g., client computing device 130) by software testing computing platform 110. Such a web dashboard may, for instance, be provided by software testing computing platform 110 to client computing device 130 and/or may include one or more of the example user interfaces discussed above.

In some embodiments, receiving the request for the test results information from the client computing device may include receiving the request for the test results information via an application programming interface. For example, in receiving the request for the test results information from the client computing device (e.g., client computing device 130), software testing computing platform 110 may receive the request for the test results information via an application programming interface. For instance, such an application programming interface may expose one or more functions provided by software testing computing platform 110 to other applications on other devices, such as client computing device 130, and an application executing on client computing device 130 may utilize one or more function calls provided by the application programming interface to request the test results information.

At step 211, software testing computing platform 110 may generate a results report. For example, at step 211, in response to receiving the request for the test results information from the client computing device (e.g., client computing device 130), software testing computing platform 110 may generate a test results report. At step 212, software testing computing platform 110 may send the results report to client computing device 130. For example, at step 212, software testing computing platform 110 may send, via the communication interface (e.g., communication interface 113), to the client computing device (e.g., client computing device 130), the test results report.

FIGS. 3A, 3B, 3C, 3D, and 3E depict another illustrative event sequence for conducting automated software testing using a centralized controller and one or more distributed test host servers in accordance with one or more example embodiments. The example event sequence depicted in FIGS. 3A, 3B, 3C, 3D, and 3E may, for instance, illustrate a series of steps executed in connection with the advanced architecture discussed above.

Referring to FIG. 3A, at step 301, software testing computing platform 110 may receive test specification details information (e.g., from enterprise server architecture 140 and/or from one or more other sources). For example, at step 301, prior to receiving a test execution request, software testing computing platform 110 may receive at least a portion of test specification details information from enterprise server architecture (e.g., enterprise server architecture 140). The test specification details information received by software testing computing platform 110 from enterprise server architecture 140 may, for instance, include: information specifying one or more specific, different tests to run for one or more specific, different types of applications; information specifying one or more specific hosts and/or specific types of hosts those tests should be run on; information specifying how to launch those tests (e.g., information specifying command line functions, arguments, parameters, and/or other launch information); and/or the like. The tests that may be defined in the test specification details information received by software testing computing platform 110 from enterprise server architecture 140 and/or subsequently run by software testing computing platform 110 and/or associated testing architecture may include any type of software application tests, such as security-related tests, server-side tests and/or service-based architecture tests, fat-client and/or heavy-user-interface tests, user-application tests, web-based application tests, and/or other types of tests.

At step 302, software testing computing platform 110 may update a test specification database based on the test specification details information received from enterprise server architecture 140. For example, at step 302, software testing computing platform 110 may store the at least the portion of the test specification details information (which may, e.g., be received from enterprise server architecture 140) in a test specification database (e.g., test specification database 112*b*).

At step 303, software testing computing platform 110 may receive a test execution request (e.g., from administrative computing device 120, identifying a particular application to be tested and a particular environment for conducting such testing). For example, at step 303, software testing computing platform 110 may receive, via a communication interface (e.g., communication interface 113), from an administrative computing device (e.g., administrative computing device 120), a test execution request. In some embodiments, receiving the test execution request from the administrative computing device may include receiving information identifying a specific software application to be tested in a specific computing environment. For example, in receiving the test execution request from the administrative computing device (e.g., administrative computing device 120), software testing computing platform 110 may receive information identifying a specific software application to be tested in a specific computing environment. In some instances, in receiving the test execution request from administrative computing device 120, software testing computing platform 110 may receive a message and/or other information from administrative computing device 120 corresponding to one or more selections made via one or more graphical user interfaces presented by administrative computing device 120, such as graphical user interface 400 depicted in FIG. 4, as discussed above.

At step 304, software testing computing platform 110 may load test specification details information from a test specification database based on the test execution request. For example, at step 304, software testing computing platform 110 may retrieve, from a test specification database (e.g., test specification database 112b), test specification details information based on the test execution request received from the administrative computing device (e.g., administrative computing device 120).

Referring to FIG. 3B, at step 305, software testing computing platform 110 may identify one or more tests to execute based on the test specification details information and the test execution request. For example, at step 305, software testing computing platform 110 may identify one or more tests to execute based on the test specification details information retrieved from the test specification database (e.g., test specification database 112b) and the test execution request received from the administrative computing device (e.g., administrative computing device 120). Software testing computing platform 110 may, for instance, identify the one or more tests to execute by matching information from the test execution request (which may, e.g., specify a particular application to be tested in a particular environment) with corresponding test specification details information (which may, e.g., specify what tests should be run to facilitate testing of the particular application, where such tests should be run, how such tests should be launched, and/or the like) so as to initiate and/or complete testing of the specified application in the specified environment. In some instances where the advanced architecture is utilized, a testing client application executing on a test host (which may, e.g., be included in and/or otherwise associated with test host server farm 150) may additionally or alternatively identify the one or more tests to execute by matching information from the test execution request (which may, e.g., specify a particular application to be tested in a particular environment) with corresponding test specification details information (which may, e.g., specify what tests should be run to facilitate testing of the particular application, where such tests should be run, how such tests should be launched, and/or the like).

At step 306, software testing computing platform 110 may generate one or more local execution commands directing test host server farm 150 to execute one or more tests (e.g., the one or more identified tests). For example, at step 306, software testing computing platform 110 may generate one or more local test execution commands directing a test host server farm (e.g., test host server farm 150) to execute the one or more tests identified based on the test specification details information retrieved from the test specification database (e.g., test specification database 112b) and the test execution request received from the administrative computing device (e.g., administrative computing device 120). In addition, the one or more local test execution commands (which may, e.g., be generated by software testing computing platform 110) may direct the test host server farm (e.g., test host server farm 150) to locally construct one or more command line instructions to be executed by the test host server farm (e.g., test host server farm 150) to complete the one or more tests. In this way, software testing computing platform 110 may initiate software application testing at test host server farm 150 by sending one or more commands to test host server farm 150, but test host server farm 150 may locally launch the appropriate tests by locally constructing and executing the command line test execution commands.

In addition, in some instances, software testing computing platform 110 may send, to test host server farm 150, information identifying the one or more software application tests to be run on a particular application. For example, such information may be included in the one or more commands generated and/or sent by software testing computing platform 110 to test host server farm 150. In other instances, however, software testing computing platform 110 might not send information identifying the one or more software application tests to be run to test host server farm 150. Rather, in these instances, test host server farm 150 itself and/or a testing client application executed on test host server farm 150 may identify the one or more tests to run based on the commands received from software testing computing platform 110 (which may, e.g., identify a particular application to be tested in a particular environment) and test specification details information retrieved by test host server farm 150 and/or the testing client application executed on test host server farm 150 from the test specification database (e.g., test specification database 112b).

At step 307, software testing computing platform 110 may send the one or more local execution commands to test host server farm 150. For example, at step 307, software testing computing platform 110 may send, via the communication interface (e.g., communication interface 113), to the test host server farm (e.g., test host server farm 150), the one or more local test execution commands directing the test host server farm (e.g., test host server farm 150) to execute the one or more tests identified based on the test specification details information retrieved from the test specification database (e.g., test specification database 112b) and the test execution request received from the administrative computing device (e.g., administrative computing device 120).

At step 308, test host server farm 150 may receive the one or more local execution commands from software testing computing platform 110. For instance, test host server farm 150 may receive the one or more local execution commands from software testing computing platform 110 using a local test client application executed on test host server farm 150 that is configured to listen for and/or otherwise receive such commands.

Figure 3C:
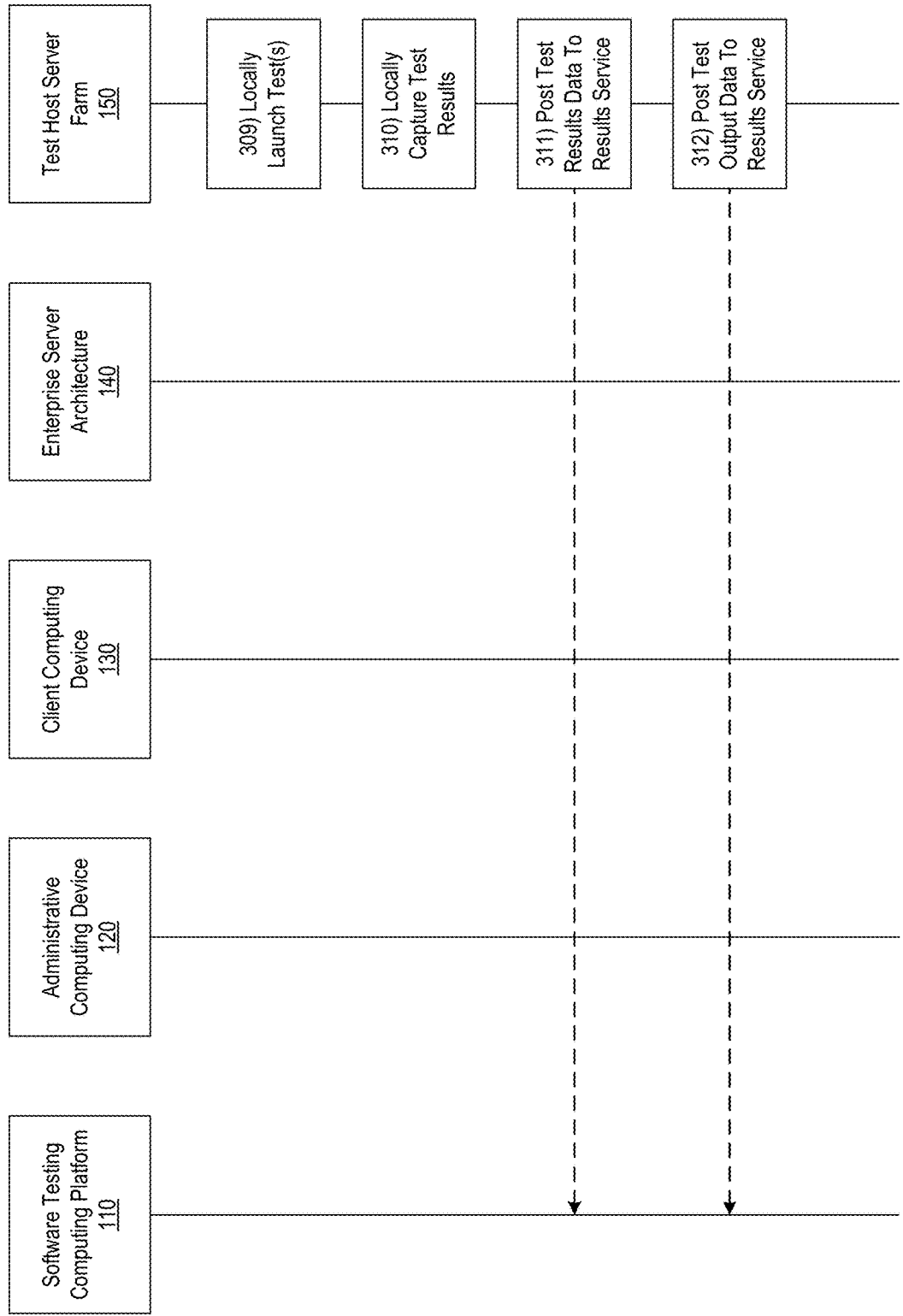

Referring to FIG. 3C, at step 309, test host server farm 150 may locally launch one or more software application tests based on the one or more local execution commands received from software testing computing platform 110. For example, at step 309, test host server farm 150 may locally launch such software application tests using a local test client application executed on test host server farm 150 that is configured to locally launch, monitor, and/or otherwise control such testing on test host server farm 150. Such a local test client application may, for instance, implement and/or otherwise incorporate one or more aspects of the "TestAll Client" discussed above in connection with FIG. 1D.

At step 310, test host server farm 150 may locally capture test results data. For example, at step 310, test host server farm 150 may locally capture test results data using the local test client application executed on test host server farm 150 (which may, e.g., be configured to locally capture raw test output and/or process such raw test output to produce test results data). At step 311, test host server farm 150 may post the test results data to a results service. For example, at step 311, test host server farm 150 may post the test results data to a results service provided by software testing computing platform 110 using the local test client application executed on test host server farm 150 (which may, e.g., be configured to upload and/or otherwise send the test results data to software testing computing platform 110 and/or test results database 112e). At step 312, test host server farm 150 may post test artifacts and/or other test output data to the results service. For example, at step 312, test host server farm 150 may post test artifacts and/or other test output data to the results service using the local test client application executed on test host server farm 150 (which may, e.g., be configured to upload and/or otherwise send the test artifacts and/or the other test output data to software testing computing platform 110 and/or test artifact cloud 112f).

Referring to FIG. 3D, at step 313, software testing computing platform 110 may receive test results data (e.g., as a result of test host server farm 150 posting such test results data to a results service provided by software testing computing platform 110). For example, at step 313, after sending the one or more local test execution commands to the test host server farm (e.g., test host server farm 150), software testing computing platform 110 may receive, via a tests results service (which may, e.g., provided by test results service module 112c), test results data from the test host server farm (e.g., test host server farm 150).

In some embodiments, the one or more local test execution commands may cause a client application executed on the test host server farm to run one or more tests on the test host server farm that write pass-fail output associated with the one or more tests to a console on the test host server farm. For example, the one or more local test execution commands (which may, e.g., be generated by software testing computing platform 110 and sent by software testing computing platform 110 to test host server farm 150) may cause a client application executed on the test host server farm (e.g., test host server farm 150) to run one or more tests on the test host server farm (e.g., test host server farm 150) that write pass-fail output associated with the one or more tests to a console on the test host server farm (e.g., test host server farm 150). As discussed above, the client application executed on the test host server farm (e.g., test host server farm 150) may, for instance, implement and/or otherwise incorporate one or more aspects of the "TestAll Client" discussed above in connection with FIG. 1D.

In some embodiments, the one or more local test execution commands may cause the client application executed on the test host server farm to locally capture output from the one or more tests run on the test host server farm. For example, the one or more local test execution commands (which may, e.g., be generated by software testing computing platform 110 and sent by software testing computing platform 110 to test host server farm 150) may cause the client application executed on the test host server farm (e.g., test host server farm 150) to locally capture output from the one or more tests run on the test host server farm (e.g., test host server farm 150).

In some embodiments, the one or more local test execution commands may cause the client application executed on the test host server farm to locally process the output captured from the one or more tests run on the test host server farm. For example, the one or more local test execution commands (which may, e.g., be generated by software testing computing platform 110 and sent by software testing computing platform 110 to test host server farm 150) may cause the client application executed on the test host server farm (e.g., test host server farm 150) to locally process the output captured from the one or more tests run on the test host server farm (e.g., test host server farm 150).

In some embodiments, the one or more local test execution commands may cause the client application executed on the test host server farm to locally process the output captured from the one or more tests run on the test host server farm by determining, at the test host server farm, that a first set of tests passed based on the output captured from the one or more tests run on the test host server farm and by determining, at the test host server farm, that a second set of tests failed based on the output captured from the one or more tests run on the test host server farm. For example, the one or more local test execution commands (which may, e.g., be generated by software testing computing platform 110 and sent by software testing computing platform 110 to test host server farm 150) may cause the client application executed on the test host server farm (e.g., test host server farm 150) to locally process the output captured from the one or more tests run on the test host server farm (e.g., test host server farm 150) by determining, at the test host server farm (e.g., test host server farm 150), that a first set of tests passed based on the output captured from the one or more tests run on the test host server farm (e.g., test host server farm 150). In addition, the one or more local test execution commands (which may, e.g., be generated by software testing computing platform 110 and sent by software testing computing platform 110 to test host server farm 150) may cause the client application executed on the test host server farm (e.g., test host server farm 150) to locally process the output captured from the one or more tests run on the test host server farm (e.g., test host server farm 150) by determining, at the test host server farm (e.g., test host server farm 150), that a second set of tests failed based on the output captured from the one or more tests run on the test host server farm (e.g., test host server farm 150).

At step 314, software testing computing platform 110 may update a test results database (e.g., based on receiving test results data). For example, at step 314, software testing computing platform 110 may store the test results data received from the test host server farm (e.g., test host server farm 150) via the tests results service in a test results database (e.g., test results database 112e). In some embodiments, storing the test results data received from the test host server farm via the tests results service in the test results database may include storing timestamps indicating when one or more specific tests started and ended, information identifying a name of a specific host on which the one or more specific tests were run, information identifying a number of assertions that passed, and information identifying a number of assertions that failed. For example, in storing the test results data received from the test host server farm (e.g., test host server farm 150) via the tests results service in the test results database (e.g., test results database 112e), software testing computing platform 110 may store timestamps indicating when one or more specific tests started and ended, information identifying a name of a specific host on which the one or more specific tests were run, information identifying a number of assertions that passed, information identifying a number of assertions that failed, and/or other information associated with the testing.

At step 315, software testing computing platform 110 may receive test output data (e.g., as a result of test host server farm 150 posting such test output data to a results service provided by software testing computing platform 110). For example, after sending the one or more local test execution commands to the test host server farm (e.g., test host server farm 150), software testing computing platform 110 may receive, via the tests results service, test output data from the test host server farm (e.g., test host server farm 150). In some instances, the test output data received by software testing computing platform 110 from test host server farm 150 may include screenshots, raw test output, and/or other artifacts associated with the testing executed at test host server farm 150. At step 316, software testing computing platform 110 may update the artifact cloud (e.g., based on receiving the test output data). For example, at step 316, software testing computing platform 110 may store the test output data received from the test host server farm (e.g., test host server farm 150) via the tests results service in a test artifact cloud (e.g., test artifact cloud 112f).

Figure 3E:
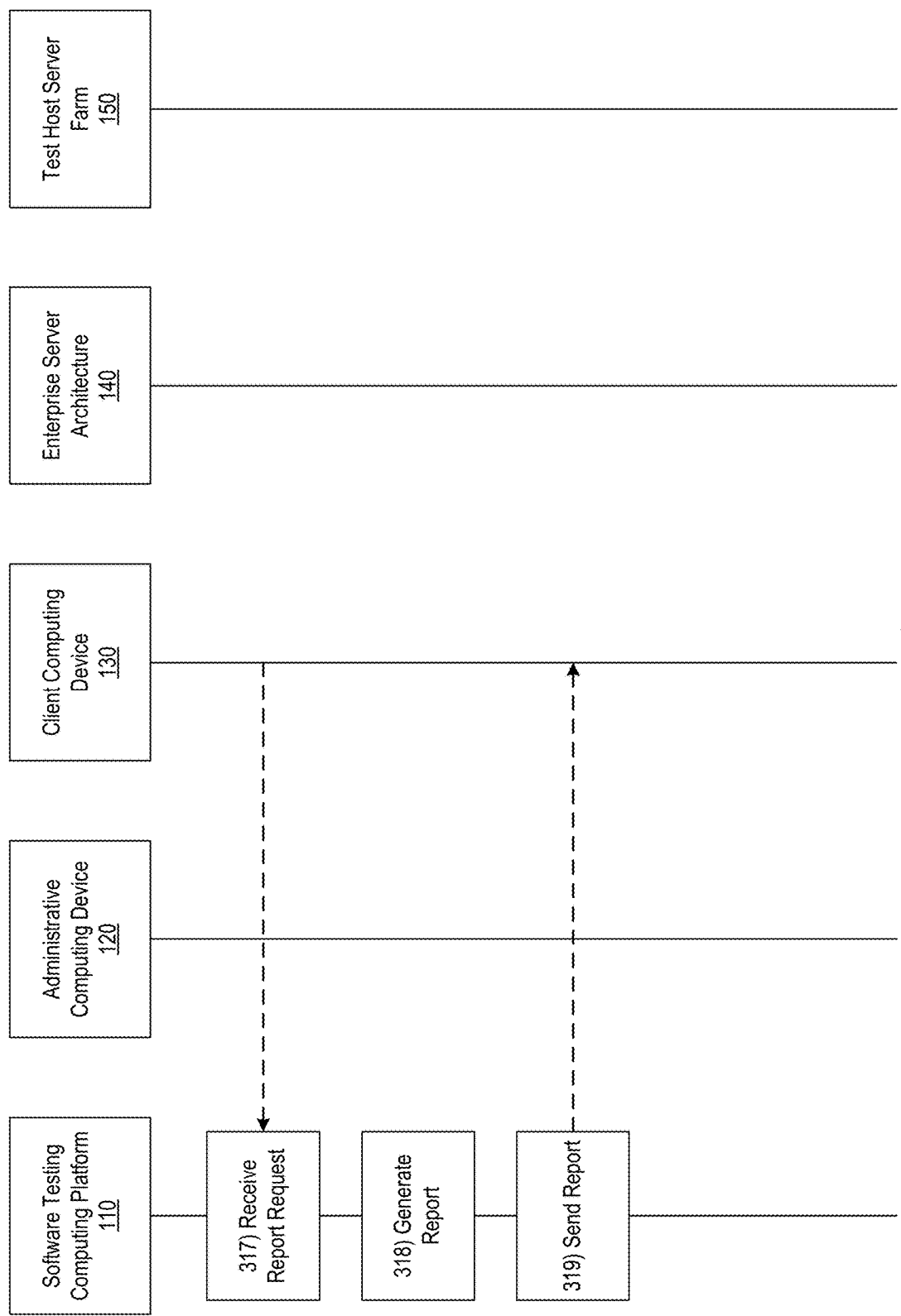

Referring to FIG. 3E, at step 317, software testing computing platform 110 may receive a report request (e.g., from client computing device 130). For example, at step 317, software testing computing platform 110 may receive, via the communication interface (e.g., communication interface 113), from a client computing device (e.g., client computing device 130), a request for test results information. In some instances, in receiving the report request from client computing device 130, software testing computing platform 110 may receive a message and/or other information from client computing device 130 corresponding to one or more selections made via one or more graphical user interfaces presented by client computing device 130, such as graphical user interface 600, which is depicted in FIG. 6, and/or graphical user interface 700, which is depicted in FIG. 7, as discussed above.

In some embodiments, receiving the request for the test results information from the client computing device may include receiving the request for the test results information via a web dashboard provided to the client computing device. For example, in receiving the request for the test results information from the client computing device (e.g., client computing device 130), software testing computing platform 110 may receive the request for the test results information via a web dashboard provided to the client computing device (e.g., client computing device 130) by software testing computing platform 110. Such a web dashboard may, for instance, be provided by software testing computing platform 110 to client computing device 130 and/or may include one or more of the example user interfaces discussed above.

In some embodiments, receiving the request for the test results information from the client computing device may include receiving the request for the test results information via an application programming interface. For example, in receiving the request for the test results information from the client computing device (e.g., client computing device 130), software testing computing platform 110 may receive the request for the test results information via an application programming interface. For instance, such an application programming interface may expose one or more functions provided by software testing computing platform 110 to other applications on other devices, such as client computing device 130, and an application executing on client computing device 130 may utilize one or more function calls provided by the application programming interface to request the test results information.

At step 318, software testing computing platform 110 may generate a results report. For example, at step 318, in response to receiving the request for the test results information from the client computing device (e.g., client computing device 130), software testing computing platform 110 may generate a test results report. At step 319, software testing computing platform 110 may send the results report to client computing device 130. For example, at step 319, software testing computing platform 110 may send, via the communication interface (e.g., communication interface 113), to the client computing device (e.g., client computing device 130), the test results report.

The event sequences discussed above illustrate examples of how software application may be conducted using the basic architecture and advanced architecture described above in connection with FIGS. 1C and 1D. In some instances, one or more steps of these example event sequences may be optional and omitted accordingly. Additionally or alternatively, one or more steps of these example event sequences may be performed in a different order than illustrated and/or may be repeated as various different applications are tested in different environments using different architectures.

Figure 8:
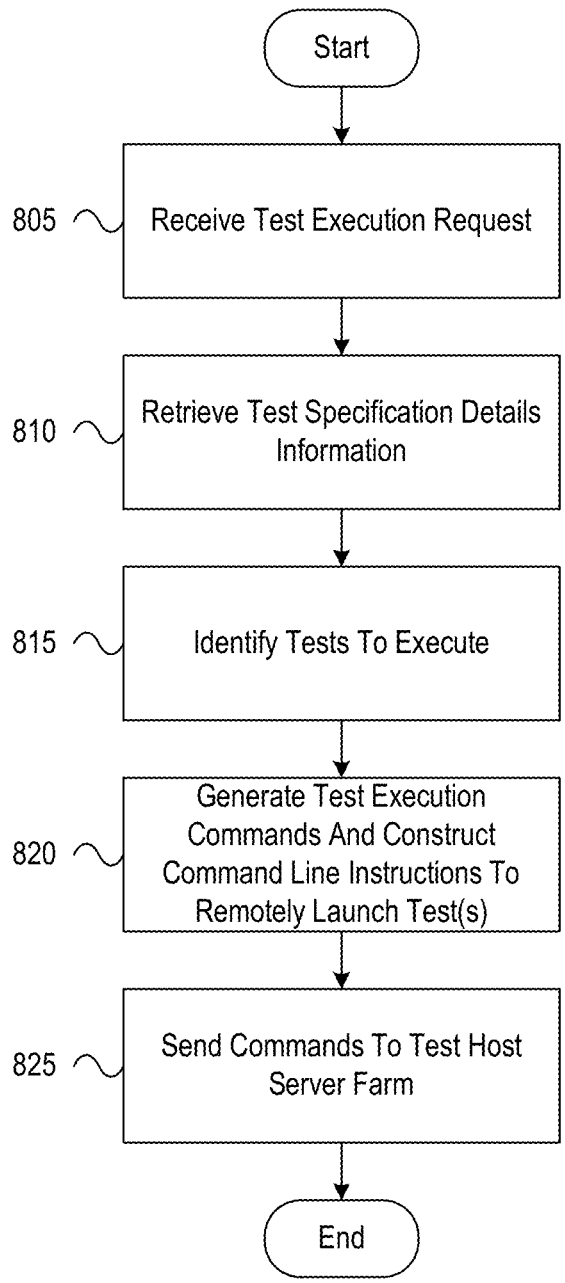
FIG. 8 depicts an illustrative method for conducting automated software testing using a centralized controller and one or more distributed test host servers in accordance with one or more example embodiments.

FIG. 8 depicts an illustrative method for conducting automated software testing using a centralized controller and one or more distributed test host servers in accordance with one or more example embodiments. Referring to FIG. 8, at step 805, a computing platform having at least one processor, a communication interface, and a memory may receive, via the communication interface, from an administrative computing device, a test execution request. At step 810, the computing platform may retrieve, from a test specification database, test specification details information based on the test execution request received from the administrative computing device. At step 815, the computing platform may identify one or more tests to execute based on the test specification details information retrieved from the test specification database and the test execution request received from the administrative computing device. At step 820, the computing platform may generate one or more remote test execution commands directing a test host server farm to execute the one or more tests identified based on the test specification details information retrieved from the test specification database and the test execution request received from the administrative computing device. In addition, generating the one or more remote test execution commands may include constructing one or more command line instructions to be executed by the test host server farm and inserting the one or more command line instructions to be executed by the test host server farm into the one or more remote test execution commands. At step 825, the computing platform may send, via the communication interface, to the test host server farm, the one or more remote test execution commands directing the test host server farm to execute the one or more tests identified based on the test specification details information retrieved from the test specification database and the test execution request received from the administrative computing device.

Figure 9:
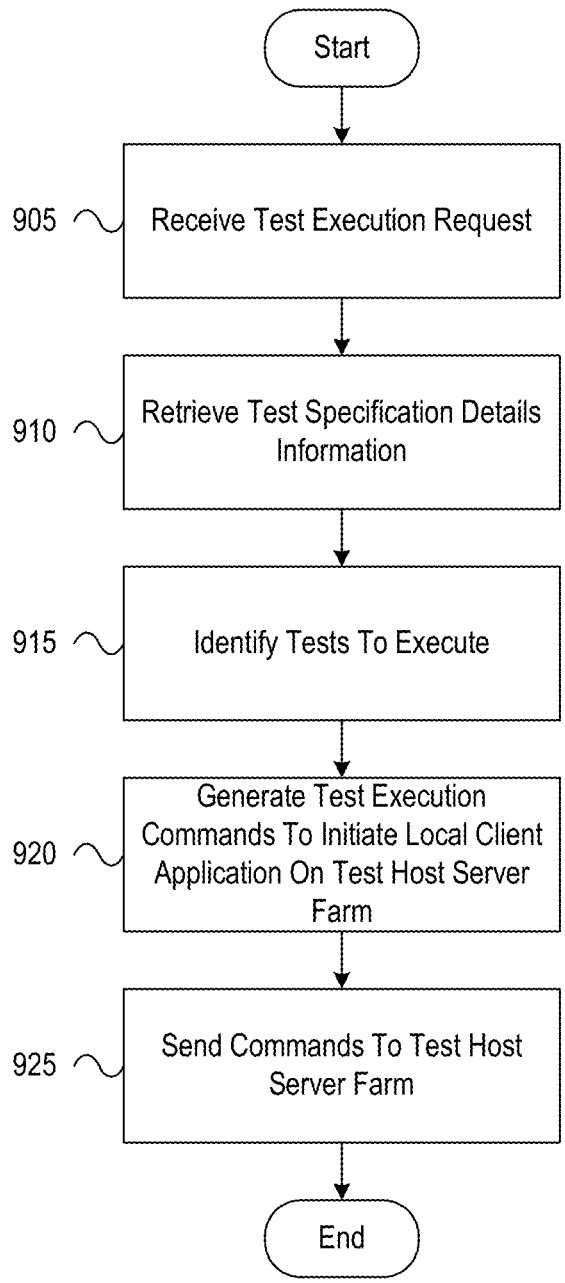
FIG. 9 depicts another illustrative method for conducting automated software testing using a centralized controller and one or more distributed test host servers in accordance with one or more example embodiments.

FIG. 9 depicts another illustrative method for conducting automated software testing using a centralized controller and one or more distributed test host servers in accordance with one or more example embodiments. Referring to FIG. 9, at step 905, a computing platform having at least one processor, a communication interface, and a memory may receive, via the communication interface, from an administrative computing device, a test execution request. At step 910, the computing platform may retrieve, from a test specification database, test specification details information based on the test execution request received from the administrative computing device. At step 915, the computing platform may identify one or more tests to execute based on the test specification details information retrieved from the test specification database and the test execution request received from the administrative computing device. At step 920, the computing platform may generate one or more local test execution commands directing a test host server farm to execute the one or more tests identified based on the test specification details information retrieved from the test specification database and the test execution request received from the administrative computing device. In addition, the one or more local test execution commands may direct the test host server farm to locally construct one or more command line instructions to be executed by the test host server farm to complete the one or more tests. At step 925, the computing platform may send, via the communication interface, to the test host server farm, the one or more local test execution commands directing the test host server farm to execute the one or more tests identified based on the test specification details information retrieved from the test specification database and the test execution request received from the administrative computing device.

One or more aspects of the disclosure may be embodied in computer-usable data or computer-executable instructions, such as in one or more program modules, executed by one or more computers or other devices to perform the operations described herein. Generally, program modules include routines, programs, objects, components, data structures, and the like that perform particular tasks or implement particular abstract data types when executed by one or more processors in a computer or other data processing device. The computer-executable instructions may be stored as computer-readable instructions on a computer-readable medium such as a hard disk, optical disk, removable storage media, solid-state memory, RAM, and the like. The functionality of the program modules may be combined or distributed as desired in various embodiments. In addition, the functionality may be embodied in whole or in part in firmware or hardware equivalents, such as integrated circuits, application-specific integrated circuits (ASICs), field programmable gate arrays (FPGA), and the like. Particular data structures may be used to more effectively implement one or more aspects of the disclosure, and such data structures are contemplated to be within the scope of computer executable instructions and computer-usable data described herein.

Various aspects described herein may be embodied as a method, an apparatus, or as one or more computer-readable media storing computer-executable instructions. Accordingly, those aspects may take the form of an entirely hardware embodiment, an entirely software embodiment, an entirely firmware embodiment, or an embodiment combining software, hardware, and firmware aspects in any combination. In addition, various signals representing data or events as described herein may be transferred between a source and a destination in the form of light or electromagnetic waves traveling through signal-conducting media such as metal wires, optical fibers, or wireless transmission media (e.g., air or space). In general, the one or more computer-readable media may be and/or include one or more non-transitory computer-readable media.

As described herein, the various methods and acts may be operative across one or more computing servers and one or more networks. The functionality may be distributed in any manner, or may be located in a single computing device (e.g., a server, a client computer, and the like). For example, in alternative embodiments, one or more of the computing platforms discussed above may be combined into a single computing platform, and the various functions of each computing platform may be performed by the single computing platform. In such arrangements, any and/or all of the above-discussed communications between computing platforms may correspond to data being accessed, moved, modified, updated, and/or otherwise used by the single computing platform. Additionally or alternatively, one or more of the computing platforms discussed above may be implemented in one or more virtual machines that are provided by one or more physical computing devices. In such arrangements, the various functions of each computing platform may be performed by the one or more virtual machines, and any and/or all of the above-discussed communications between computing platforms may correspond to data being accessed, moved, modified, updated, and/or otherwise used by the one or more virtual machines.

Aspects of the disclosure have been described in terms of illustrative embodiments thereof. Numerous other embodiments, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

What is claimed is:

1. A computing platform, comprising:
   at least one processor;
   a communication interface communicatively coupled to the at least one processor; and
   memory storing computer-readable instructions that, when executed by the at least one processor, cause the computing platform to:
      receive, via the communication interface, from an administrative computing device, a test execution request;
      retrieve, from a test specification database, test specification details information based on the test execution request received from the administrative computing device;
      identify one or more tests to execute based on the test specification details information retrieved from the test specification database and the test execution request received from the administrative computing device;
      generate one or more remote test execution commands directing a test host server farm to execute the one or more tests identified based on the test specification details information retrieved from the test specification database and the test execution request received from the administrative computing device, wherein generating the one or more remote test execution commands comprises constructing one or more command line instructions to be executed by the test host server farm and inserting the one or more command line instructions to be executed by the test host server farm into the one or more remote test execution commands;

send, via the communication interface, to the test host server farm, the one or more remote test execution commands directing the test host server farm to execute the one or more tests identified based on the test specification details information retrieved from the test specification database and the test execution request received from the administrative computing device;

after sending the one or more remote test execution commands to the test host server farm, remotely capture test output from the test host server farm; and store test results data based on remotely capturing the test output from the test host server farm, wherein the one or more command line instructions to be executed by the test host server farm cause the test host server farm to run one or more tests that write pass-fail output associated with the one or more tests to a console, and wherein remotely capturing the test output from the test host server farm comprises capturing the pass-fail output associated with the one or more tests from the console.

2. The computing platform of claim 1, wherein receiving the test execution request from the administrative computing device comprises receiving information identifying a specific software application to be tested in a specific computing environment.

3. The computing platform of claim 1, wherein remotely capturing the test output from the test host server farm comprises processing the test output captured from the test host server farm to produce at least a portion of the test results data.

4. The computing platform of claim 3, wherein processing the test output captured from the test host server farm to produce the at least the portion of the test results data comprises determining that a first set of tests passed based on the test output captured from the test host server farm and determining that a second set of tests failed based on the test output captured from the test host server farm.

5. The computing platform of claim 1, wherein storing the test results data based on remotely capturing the test output from the test host server farm comprises storing results information in a test results database and storing test artifacts in a test artifact cloud.

6. The computing platform of claim 5, wherein storing the results information in the test results database comprises storing timestamps indicating when one or more specific tests started and ended, information identifying a name of a specific host on which the one or more specific tests were run, information identifying a number of assertions that passed, and information identifying a number of assertions that failed.

7. The computing platform of claim 1, wherein the memory stores additional computer-readable instructions that, when executed by the at least one processor, cause the computing platform to:

prior to receiving the test execution request from the administrative computing device:
receive at least a portion of the test specification details information from enterprise server architecture; and
store the at least the portion of the test specification details information in the test specification database.

8. The computing platform of claim 1, wherein the memory stores additional computer-readable instructions that, when executed by the at least one processor, cause the computing platform to:

receive, via the communication interface, from a client computing device, a request for test results information;

in response to receiving the request for the test results information from the client computing device, generate a test results report; and send, via the communication interface, to the client computing device, the test results report.

9. The computing platform of claim 8, wherein receiving the request for the test results information from the client computing device comprises receiving the request for the test results information via a web dashboard provided to the client computing device.

10. The computing platform of claim 8, wherein receiving the request for the test results information from the client computing device comprises receiving the request for the test results information via an application programming interface.

11. A method, comprising:

at a computing platform comprising at least one processor, memory, and a communication interface:
receiving, by the at least one processor, via the communication interface, from an administrative computing device, a test execution request;
retrieving, by the at least one processor, from a test specification database, test specification details information based on the test execution request received from the administrative computing device;
identifying, by the at least one processor, one or more tests to execute based on the test specification details information retrieved from the test specification database and the test execution request received from the administrative computing device;
generating, by the at least one processor, one or more remote test execution commands directing a test host server farm to execute the one or more tests identified based on the test specification details information retrieved from the test specification database and the test execution request received from the administrative computing device, wherein generating the one or more remote test execution commands comprises constructing one or more command line instructions to be executed by the test host server farm and inserting the one or more command line instructions to be executed by the test host server farm into the one or more remote test execution commands;
sending, by the at least one processor, via the communication interface, to the test host server farm, the one or more remote test execution commands directing the test host server farm to execute the one or more tests identified based on the test specification details information retrieved from the test specification database and the test execution request received from the administrative computing device;
after sending the one or more remote test execution commands to the test host server farm, remotely capturing, by the at least one processor, test output from the test host server farm; and
storing, by the at least one processor, test results data based on remotely capturing the test output from the test host server farm,
wherein the one or more command line instructions to be executed by the test host server farm cause the test host server farm to run one or more tests that write pass-fail output associated with the one or more tests to a console, and wherein remotely capturing the test output from the test host server farm comprises capturing the pass-fail output associated with the one or more tests from the console.

12. The method of claim 11, wherein receiving the test execution request from the administrative computing device comprises receiving information identifying a specific software application to be tested in a specific computing environment.

13. The method of claim 11, wherein remotely capturing the test output from the test host server farm comprises processing the test output captured from the test host server farm to produce at least a portion of the test results data.

14. The method of claim 13, wherein processing the test output captured from the test host server farm to produce the at least the portion of the test results data comprises determining that a first set of tests passed based on the test output captured from the test host server farm and determining that a second set of tests failed based on the test output captured from the test host server farm.

15. The method of claim 11, wherein storing the test results data based on remotely capturing the test output from the test host server farm comprises storing results information in a test results database and storing test artifacts in a test artifact cloud.

16. The method of claim 15, wherein storing the results information in the test results database comprises storing timestamps indicating when one or more specific tests started and ended, information identifying a name of a specific host on which the one or more specific tests were run, information identifying a number of assertions that passed, and information identifying a number of assertions that failed.

17. The method of claim 11, comprising:
prior to receiving the test execution request from the administrative computing device:
receiving, by the at least one processor, at least a portion of the test specification details information from enterprise server architecture; and
storing, by the at least one processor, the at least the portion of the test specification details information in the test specification database.

18. The method of claim 11, comprising:
receiving, by the at least one processor, via the communication interface, from a client computing device, a request for test results information;
in response to receiving the request for the test results information from the client computing device, generating, by the at least one processor, a test results report; and
sending, by the at least one processor, via the communication interface, to the client computing device, the test results report.

19. The method of claim 18, wherein receiving the request for the test results information from the client computing device comprises receiving the request for the test results information via a web dashboard provided to the client computing device.

20. One or more non-transitory computer-readable media storing instructions that, when executed by a computing platform comprising at least one processor, memory, and a communication interface, cause the computing platform to:
receive, via the communication interface, from an administrative computing device, a test execution request;
retrieve, from a test specification database, test specification details information based on the test execution request received from the administrative computing device;
identify one or more tests to execute based on the test specification details information retrieved from the test specification database and the test execution request received from the administrative computing device;
generate one or more remote test execution commands directing a test host server farm to execute the one or more tests identified based on the test specification details information retrieved from the test specification database and the test execution request received from the administrative computing device, wherein generating the one or more remote test execution commands comprises constructing one or more command line instructions to be executed by the test host server farm and inserting the one or more command line instructions to be executed by the test host server farm into the one or more remote test execution commands;
send, via the communication interface, to the test host server farm, the one or more remote test execution commands directing the test host server farm to execute the one or more tests identified based on the test specification details information retrieved from the test specification database and the test execution request received from the administrative computing device;
after sending the one or more remote test execution commands to the test host server farm, remotely capture test output from the test host server farm; and
store test results data based on remotely capturing the test output from the test host server farm,
wherein the one or more command line instructions to be executed by the test host server farm cause the test host server farm to run one or more tests that write pass-fail output associated with the one or more tests to a console, and
wherein remotely capturing the test output from the test host server farm comprises capturing the pass-fail output associated with the one or more tests from the console.

* * * * *